United States Patent
Yamazaki

(10) Patent No.: US 8,530,944 B2
(45) Date of Patent: Sep. 10, 2013

(54) SEMICONDUCTOR DEVICE

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 266 days.

(21) Appl. No.: 13/037,686

(22) Filed: Mar. 1, 2011

(65) Prior Publication Data

US 2011/0215385 A1  Sep. 8, 2011

(30) Foreign Application Priority Data

Mar. 8, 2010  (JP) ................. 2010-051021

(51) Int. Cl.
*H01L 29/78* (2006.01)

(52) U.S. Cl.
USPC ........ 257/288; 257/59; 257/57; 257/E29.255; 257/E21.15; 438/34; 438/104; 438/706; 438/59

(58) Field of Classification Search
USPC ............... 257/288, E29.255, 59, 57, E21.15, 257/66, 43, 775, 40; 438/34, 104, 706, 59
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

(Continued)

*Primary Examiner* — Cathy N Lam
(74) *Attorney, Agent, or Firm* — Eric J. Robinson; Robinson Intellectual Property Law Office, P.C.

(57) ABSTRACT

An object is to provide a semiconductor device which achieves miniaturization as well as suppressing a defect. Further, another object is to provide a semiconductor device which achieves miniaturization as well as keeping favorable characteristics. Is provided a semiconductor device including: a source wiring and a drain wiring each of which include a first conductive layer and a second conductive layer having a smaller thickness than the first conductive layer; an insulating layer which has an opening portion and is provided over the source wiring and the drain wiring; an oxide semiconductor layer which is in contact with part of the second conductive layer of the source wiring or the drain wiring in the opening portion; a gate insulating layer provided over the oxide semiconductor layer; and a gate electrode provided over the gate insulating layer.

22 Claims, 12 Drawing Sheets

(56) References Cited

U.S. PATENT DOCUMENTS

| | | | |
|---|---|---|---|
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0203501 A1 | 8/2008 | Yamazaki et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0155946 A1 * | 6/2009 | Park et al. | 438/34 |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0180796 A1 | 7/2011 | Yamazaki et al. | |
| 2011/0193080 A1 | 8/2011 | Yamazaki et al. | |
| 2011/0210326 A1 | 9/2011 | Suzawa et al. | |
| 2011/0215317 A1 | 9/2011 | Yamazaki et al. | |
| 2011/0215326 A1 | 9/2011 | Godo et al. | |
| 2011/0297940 A1 * | 12/2011 | Yamaguchi et al. | 257/57 |
| 2012/0045959 A1 * | 2/2012 | Akimoto et al. | 445/24 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-281772 A | 11/1989 |
| JP | 04-334065 A | 11/1992 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-073702 A | 3/2007 |
| JP | 2008-235873 A | 10/2008 |
| JP | 2009-206388 A | 9/2009 |
| JP | 2010-021170 A | 1/2010 |
| WO | WO-2004/114391 | 12/2004 |

OTHER PUBLICATIONS

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$-$Ga_2ZnO_4$-ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$-$ZnGa_2O_4$-ZnO System,", Journal of Solid State Chemistry, Apr. 1, 1995, vol. 116, No. 1, pp. 170-178.

Nakamura.M et al., "Syntheses and crystal structures of new homologous compounds, indium iron zinc oxides ($InFeO_3(ZnO)_m$) (m natural number) and related compounds,", Kotai Butsuri (Solid State Physics), 1993, vol. 28, No. 5, pp. 317-327.

Nomura.K et al., "Thin-Film Transistor Fabricated in Single-Crystalline Transparent Oxide Semiconductor,", Science, May 23, 2003, vol. 300, No. 5623, pp. 1269-1272.

Kawamura.T et al., "Low-Voltage Operating Amorphous Oxide TFTs,", IDW '09 : Proceedings of the 16th International Display Workshops, Dec. 9, 2009, pp. 1689-1692.

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08: SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.O et al., "Modulated Structures of Homologous Compounds InMO3(ZnO)m (M=In,Ga; m=Integer) Describe by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO)TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08: SID International Symposium Digest of Technical Papers, May 20, 2008, vol. 39, pp. 625-628.

Nowatari.H et al., "60.2: Intermediate Connector With Suppressed Voltage Loss For White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AMOLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

International Search Report (Application No. PCT/JP2011/053879) Dated May 31, 2011.

Written Opinion (Application No. PCT/JP2011/053879) Dated May 31, 2011.

* cited by examiner

SEMICONDUCTOR DEVICE

TECHNICAL FIELD

The present invention relates to a semiconductor device. Note that here, semiconductor devices refer to general elements and devices which function utilizing semiconductor characteristics.

BACKGROUND ART

There are a wide variety of metal oxides and such metal oxides are used for various applications. Indium oxide is a well-known material and has been used for transparent electrodes required in liquid crystal display devices or the like.

Some metal oxides have semiconductor characteristics. The examples of such metal oxides having semiconductor characteristics are, for example, tungsten oxide, tin oxide, indium oxide, zinc oxide, and the like. A thin film transistor in which a channel formation region is formed using such a metal oxide is already known (for example, see Patent Documents 1 to 4, Non-Patent Document 1, and the like).

Examples of metal oxides include not only an oxide of a single metal element but also an oxide of a plurality of metal elements (multi-component oxides). For example, $InGaO_3(ZnO)_m$ (m is a natural number) which is a homologous compound is a known material as multi-component oxides including In, Ga, and Zn (e.g., see Non-Patent Documents 2 to 4 and the like).

In addition, it has been confirmed that an oxide semiconductor including such an In—Ga—Zn-based oxide can be used for a channel formation region of a thin film transistor (e.g., see Patent Document 5, Non-Patent Documents 5 and 6, and the like).

In order to achieve high speed operation of a transistor or the like, miniaturization of the transistor is needed. For example, in Patent Document 6, a thin film transistor including an oxide semiconductor used for a channel layer with a thickness of about 10 nm or smaller is disclosed. In Non-Patent Document 7, a thin film transistor including an oxide semiconductor whose channel length is 2 μm to 100 μm is disclosed.

REFERENCE

Patent Document

[Patent Document 1] Japanese Published Patent Application No. S60-198861
[Patent Document 2] Japanese Published Patent Application No. H8-264794
[Patent Document 3] Japanese Published Patent Application No. H11-505377, which is a translation of PCT International Application
[Patent Document 4] Japanese Published Patent Application No. 2000-150900
[Patent Document 5] Japanese Published Patent Application No. 2004-103957
[Patent Document 6] Japanese Published Patent Application No. 2010-021170

Non-Patent Document

[Non-Patent Document 1] M. W. Prins, K. O. Grosse-Holz, G Muller, J. F. M. Cillessen, J. B. Giesbers, R. P. Weening, and R. M. Wolf, "A ferroelectric transparent thin-film transistor", *Appl. Phys. Lett.,* 17 Jun. 1996, Vol. 68, pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.,* 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.,* 1995, Vol. 116, pp. 170-178
[Non-Patent Document 4] M. Nakamura, N. Kimizuka, T. Mohri, and M. Isobe, "Syntheses and crystal structures of new homologous compounds, indium iron zinc oxides ($InFeO_3(ZnO)_m$) (m:natural number) and related compounds", *KOTAI BUTSURI (SOLID STATE PHYSICS),* 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE,* 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE,* 2004, Vol. 432, pp. 488-492
[Non-Patent Document 7] T. Kawamura, H. Uchiyama, S. Saito, H. Wakana, T. Mine, and M. Hatano, "Low-Voltage Operating Amorphous Oxide TFTs", IDW'09, pp. 1689-1692

DISCLOSURE OF INVENTION

In the case where a transistor is miniaturized, a defect generated in the manufacturing process becomes a major problem. For example, in a transistor where a semiconductor layer is formed over a wiring functioning as a source or drain wiring, a gate wiring or the like, the wiring has a larger thickness than the semiconductor layer, which causes poor coverage with the semiconductor layer when the thickness of the semiconductor layer is reduced along with miniaturization. As a result, disconnection, poor connection, or the like may occur.

Further, in the case where a transistor is miniaturized, another problem of a short channel effect arises. The short channel effect refers to degradation of electric characteristics which becomes obvious with miniaturization of a transistor (a reduction in channel length (L)). The short channel effect results from the influence of an electric field of a drain on a source. Specific examples of the short channel effect are a decrease in threshold voltage, an increase in subthreshold swing (S value), an increase in the amount of leakage current, and the like. The short channel effect is likely to occur in a transistor including an oxide semiconductor particularly because such a transistor cannot control threshold voltage by doping, unlike a transistor including silicon.

In view of this, an object of one embodiment of the disclosed invention is to provide a semiconductor device which achieves miniaturization as well as suppressing a defect. Further, another object of one embodiment of the disclosed invention is to provide a semiconductor device which achieves miniaturization as well as keeping favorable characteristics.

A semiconductor device which is one embodiment of the disclosed invention includes a source wiring and a drain wiring each of which includes a first conductive layer and a second conductive layer having a smaller thickness than the first conductive layer. In each of the source wiring and the drain wiring, a region in contact with an oxide semiconductor layer is a high resistance region which is formed of a single layer of the second conductive layer with a small thickness, whereby an electric field between source and drain is relaxed and coverage with the oxide semiconductor layer is increased. In contrast, for a wiring led to be used for connection with an external circuit (hereinafter, a lead wiring), the first conductive layer with a large thickness or a stacked layer of the first conductive layer and the second conductive layer is used, whereby wiring resistance of the lead wiring is reduced.

Specifically, the following structure can be employed.

One embodiment of the present invention is a semiconductor device which includes: a source wiring and a drain wiring each of which includes a first conductive layer and a second conductive layer having a smaller thickness than the first conductive layer; an insulating layer which has an opening portion and is provided over the source wiring and the drain wiring; an oxide semiconductor layer which is provided over the insulating layer and in contact with part of the source wiring or the drain wiring in the opening portion; a gate insulating layer provided over the oxide semiconductor layer; and a gate electrode provided over the gate insulating layer. The source wiring or the drain wiring has a region formed of a single layer of the second conductive layer. The oxide semiconductor layer is in contact with the source wiring or the drain wiring in the region formed of the single layer of the second conductive layer.

Another embodiment of the present invention is a semiconductor device which includes: a source wiring and a drain wiring provided to be apart from each other; an insulating layer provided over the source wiring and the drain wiring so that a space between the source wiring and the drain wiring is filled; an oxide semiconductor layer provided over the insulating layer; a gate insulating layer provided over the oxide semiconductor layer; and a gate electrode provided over the gate insulating layer. The source wiring and the drain wiring each include a first conductive layer and a second conductive layer having a smaller thickness than the first conductive layer and has a region formed of a single layer of the second conductive layer. The insulating layer has an opening portion in a region overlapping with the region formed of a single layer of the second conductive layer functioning as the source wiring and an opening portion in a region overlapping with the region formed of a single layer of the second conductive layer functioning as the drain wiring. The oxide semiconductor layer is in contact with part of the second conductive layer functioning as the source wiring or the drain wiring in the opening portion provided in the insulating layer.

In the above semiconductor device, it is preferable that the second conductive layer have a larger length in the channel length direction than the first conductive layer.

In the above semiconductor device, it is preferable for a material of the second conductive layer to use a metal material having a higher work function than the oxide semiconductor layer.

In the above semiconductor device, it is preferable that a region, in each of the source wiring and the drain wiring, which is led for connection with an external circuit be formed of a single layer of the first conductive layer or a stacked layer of the first conductive layer and the second conductive layer.

Note that the channel length L of the transistor is preferably smaller than 2 µm, further preferably, larger than or equal to 10 nm and smaller than or equal to 350 nm (0.35 µm). The thickness of the oxide semiconductor layer is larger than or equal to 1 nm and smaller than or equal to 50 nm, preferably, larger than or equal to 2 nm and smaller than or equal to 20 nm, further preferably, larger than or equal to 3 nm and smaller than or equal to 15 nm. With such a structure, a semiconductor device which operates at high speed and consumes low power can be achieved. For the gate insulating layer, a high dielectric constant material such as hafnium oxide is used. For example, relative dielectric constant of hafnium oxide is approximately 15, which is much higher than that of silicon oxide which is 3 to 4. With such a material, a gate insulating layer where the silicon oxide equivalent oxide thickness is smaller than 15 nm, preferably larger than or equal to 2 nm and smaller than or equal to 10 nm can be easily formed. In other words, the semiconductor device can be easily miniaturized. Further, as the oxide semiconductor layer, an intrinsic oxide semiconductor which is highly purified is used. With such an oxide semiconductor, the carrier density due to a donor such as hydrogen of the oxide semiconductor layer can be, for example, lower than $1 \times 10^{12}/cm^3$, preferably, lower than $1.45 \times 10^{10}/cm^3$, the off-state current of the transistor can be 100 zA/µm (1 zA (zeptoampere) is $1 \times 10^{-21}$ A) or less, preferably, 10 zA/µm or less, and the S value of the transistor can be 65 mV/dec or less, preferably, less than 63 mV/dec. When the above structure is employed, the off-state current of the transistor can be $1 \times 10^{-24}$ A/µm to $1 \times 10^{-30}$ A/µm in theory. The gate electrode may be provided to overlap with the source wiring and the drain wiring, and alternatively, only an edge of the gate electrode may be provided to overlap with an edge of the source wiring and an edge of the drain wiring.

Note that the semiconductor device in this specification indicates all the devices that operate by utilizing semiconductor characteristics. For example, a display device, a memory device, an integrated circuit and the like are included in the category of the semiconductor device.

In this specification and the like, the terms "over" and "below" do not necessarily mean "directly on" and "directly below", respectively, in the description of a physical relationship between components. For example, the expression "a gate electrode over a gate insulating layer" can mean the case where there is an additional component between the gate insulating layer and the gate electrode.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" are formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be used to denote the drain and the source, respectively, in this specification.

Note that in this specification and the like, the term "electrically connected" includes the case where components are connected through an "object having any electric function". There is no particular limitation on an "object having any electric function" as long as electric signals can be transmitted and received between components that are connected through the object. Examples of an "object having any electric function" include a switching element such as a transistor, a resistor, an inductor, a capacitor, and an element with a variety of functions as well as an electrode and a wiring.

According to one embodiment of the disclosed invention, a problem caused by miniaturization can be resolved. As a result, the size of the transistor can be sufficiently reduced. By sufficiently downsizing the transistor, an area of a semiconductor device including the transistor is decreased, and the number of semiconductor devices manufactured with one substrate is increased. Therefore, the manufacturing cost per semiconductor device is decreased. Further, since the semiconductor device is downsized, a semiconductor device with a size similar to that of the conventional semiconductor device can have improved functions. Moreover, advantageous effects such as high-speed operation and low power consumption due to a reduction in channel length can be obtained. That is, according to one embodiment of the disclosed invention, miniaturization of a transistor including an oxide semiconductor is achieved, so that a variety of advantageous effects accompanying therewith can be obtained.

As described above, according to one embodiment of the disclosed invention, a semiconductor device which achieves miniaturization as well as suppressing defect or keeping favorable characteristics can be provided.

BEST MODE FOR CARRYING OUT THE INVENTION

Figure 1A:
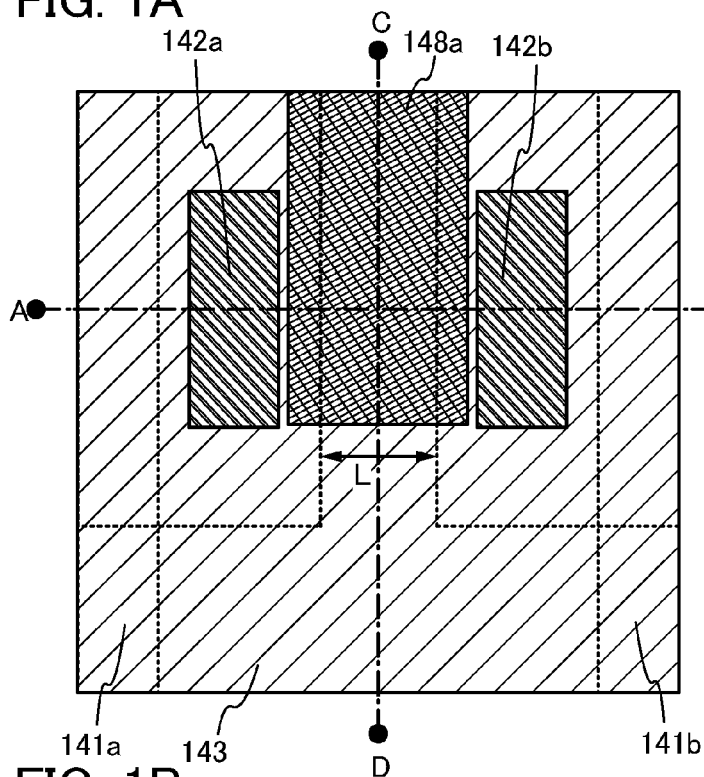
FIGS. 1A to 1C are a top view of a semiconductor device and cross-sectional views thereof.

Hereinafter, embodiments of the present invention will be described with reference to the drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiments.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not limit the components numerically.

Embodiment 1

In this embodiment, a structure and a manufacturing method of a semiconductor device according to one embodiment of the disclosed invention will be described with reference to FIGS. 1A to 1C, FIGS. 2A to 2E, and FIGS. 3A to 3E.

<Structural Example of Semiconductor Device>

Figure 1C:
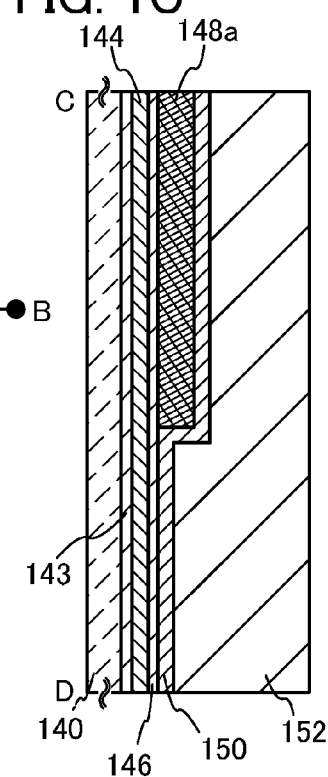
Figure 1B:
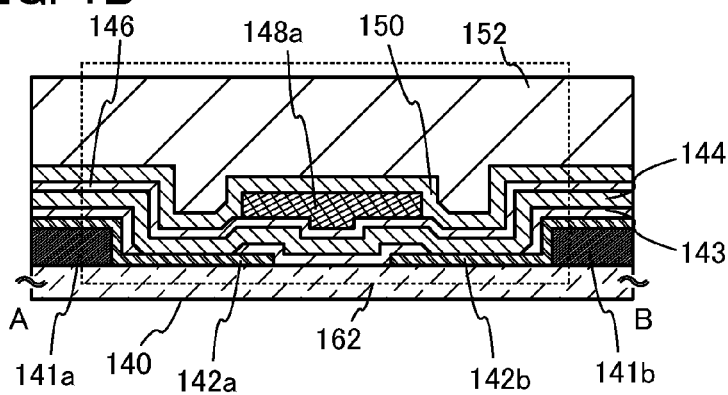

FIGS. 1A to 1C and FIGS. 2A to 2E illustrate structural examples of semiconductor devices. FIGS. 1A to 1C illustrate a first structural example, and FIGS. 2A to 2E illustrate a second structural example.

FIG. 1A is a top view of a transistor 162, and FIG. 1B is a cross-sectional view taken along a line A-B of FIG. 1A. FIG. 1C is a cross-sectional view taken along a line C-D of FIG. 1A.

The transistor 162 illustrated in FIGS. 1A to 1C includes, over a base 140 having a surface where components are formed, a source wiring including a first conductive layer 141a and a second conductive layer 142a, a drain wiring including a first conductive layer 141b and a second conductive layer 142b, an insulating layer 143 which has opening portions and is provided over the source and drain wirings, an oxide semiconductor layer 144 which is in contact with parts of the second conductive layers 142a and 142b in the opening portions and provided over the insulating layer 143, a gate insulating layer 146 covering the oxide semiconductor layer 144, and a gate electrode 148a over the gate insulating layer 146.

As in FIGS. 1A to 1C, when an oxide semiconductor is used for an active layer of a transistor, favorable characteristics can be obtained. For example, an S value of the transistor can be less than or equal to 65 mV/dec, preferably, less than 63 mV/dec.

Further, in FIGS. 1A to 1C, an insulating layer 150 and an insulating layer 152 are provided to cover the gate insulating layer 146, the gate electrode 148a, and the like. However, the insulating layer 150 and the insulating layer 152 are not necessarily provided.

In the transistor 162 illustrated in FIGS. 1A to 1C, the second conductive layer 142a in the source wiring has a smaller thickness than the first conductive layer 141a, and similarly, the second conductive layer 142b in the drain wiring has a smaller thickness than the first conductive layer 141b. That is, the second conductive layers 142a and 142b have a small area of a cross section perpendicular to the flow of electric charges. Since resistance is inversely proportional to the area of the cross section, in the source wiring, a region formed of a single layer of the second conductive layer 142a with a small thickness is a region having higher resistance (hereinafter, also referred to as a high resistance region) than a region formed of a single layer of the first conductive layer 141a or a region formed of a stacked layer of the first conductive layer 141a and the second conductive layer 142a. Also in the drain wiring, a region formed of a single layer of the second conducive layer 142b with a small thickness is a region having higher resistance than a region formed of a single layer of the first conductive layer 141b or a region formed of a stacked layer of the first conductive layer 141b and the second conductive layer 142b. In addition, in the source wiring, the length in the channel length direction of the second conductive layer 142a positioned on the channel formation region side is larger than that of the first conductive layer 141a, and the second conductive layer 142a has a high resistance region (formed of a single layer of the second conductive layer 142a) extended beyond an edge portion of the first conductive layer 141a in the channel length direction. Similarly, in the drain wiring, the length in the channel length direction of the second conductive layer 142b positioned on the channel formation region side is larger than that of the first conductive layer 141b, and the second conductive layer 142b has a high resistance region (formed of a single layer of the second conductive layer 142b) extended beyond an edge portion of the first conductive layer 141b in the channel length direction.

In the transistor 162 illustrated in FIGS. 1A to 1C, the source wiring in the high resistance region or the drain wiring in the high resistance region is in contact with the oxide semiconductor layer 144, whereby an electric field between the source and drain can be relaxed, and a short channel effect occurring due to miniaturization of the transistor can be suppressed. Since the second conductive layer 142a or 142b has a small thickness, the coverage with the gate insulating layer 146 provided over the oxide semiconductor layer 144 can be favorable. In addition, the oxide semiconductor layer 144 is in contact with part of a top surface of the source wiring or the drain wiring, and the coverage with the oxide semiconductor layer 144 can be favorable. Furthermore, in FIGS. 1A to 1C, in a region functioning as a lead wiring of the source wiring or the drain wiring, through which voltage or current is supplied to the transistor 162, the first conductive layer 141a or 141b with a large thickness is used. With such a structure, wiring resistance of the lead wiring can be reduced.

Here, it is preferable that the oxide semiconductor layer 144 be highly purified by sufficient removal of impurities such as hydrogen or sufficient supply of oxygen. Specifically, the hydrogen concentration of the oxide semiconductor layer 144 is $5\times10^{19}$ atoms/cm$^3$ or lower, preferably $5\times10^{18}$ atoms/cm$^3$ or lower, further preferably $5\times10^{17}$ atoms/cm$^3$ or lower. Note that the concentration of hydrogen in the oxide semiconductor layer 144 is measured by secondary ion mass spectrometry (SIMS). In the oxide semiconductor layer 144 which is highly purified by sufficiently reducing the hydrogen concentration therein and in which a defect level in an energy gap due to oxygen deficiency is reduced by supplying a sufficient amount of oxygen, the carrier concentration due to a donor such as hydrogen is lower than $1\times10^{12}$/cm$^3$, preferably lower than $1\times10^{11}$/cm$^3$, further preferably lower than $1.45\times10^{19}$/cm$^3$. For example, the off-state current (per unit channel width (1 μm) here) at room temperature (25° C.) is 100 zA (1 zA (zeptoampere) is $1\times10^{-21}$ A) or less, preferably 10 zA or less. In this manner, by using an oxide semiconductor which is made to be an i-type (intrinsic) oxide semiconductor or a substantially i-type oxide semiconductor, the transistor 162 which has extremely favorable off-state current characteristics can be obtained.

Note that as disclosed in Non-Patent Document 7 and the like, a relatively large size transistor whose channel length is 2 μm to 100 μm can be manufactured with use of an n-type oxide semiconductor having a large carrier density of $2\times10^{19}$/cm$^3$. However, when such a material is applied to a miniaturized transistor whose channel length is smaller than 2 μm, the threshold voltage drastically shifts negatively, and thus it is difficult to realize a normally-off transistor. In other words, the transistor which has a channel length of smaller than 2 μm and is manufactured using such a material does not work in practice. In contrast, an intrinsic or substantially intrinsic oxide semiconductor which is highly purified has a carrier density of at most lower than $1\times10^{14}$/cm$^3$, which does not cause a problem of normally on; thus, with use of such an intrinsic or substantially intrinsic oxide semiconductor, a transistor whose channel length is smaller than 2 μm can be easily realized.

In the transistor 162, the first conductive layers 141a and 141b or the second conductive layers 142a and 142b may be tapered. The taper angle can be greater than or equal to 30° and less than or equal to 60°, for example. Note that the "taper angle" means an inclination angle formed with a side surface and a bottom surface of a layer (for example, the second conducive layer 142a) having a tapered shape when the layer is observed in a direction perpendicular to the cross-section (a plane which is perpendicular to the surface of the base 140) of the layer.

Figure 2A:
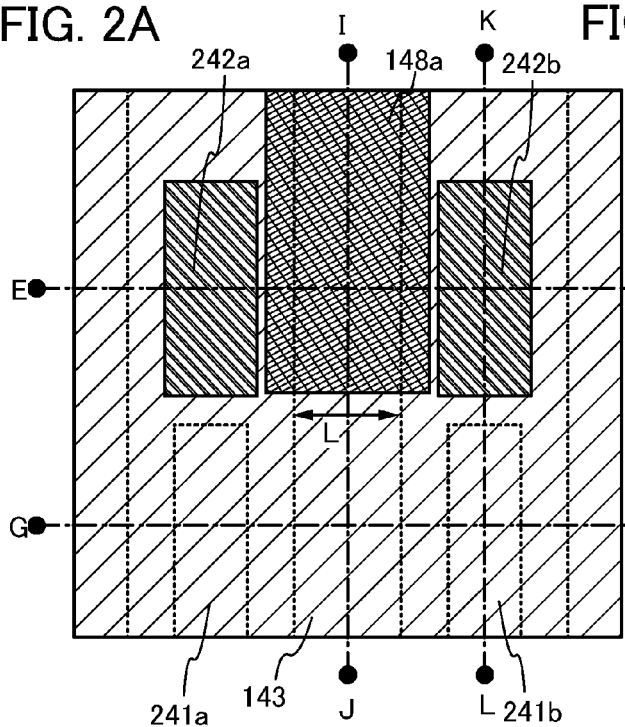
FIGS. 2A to 2E are a top view of a semiconductor device and cross-sectional views thereof.
Figure 2B:
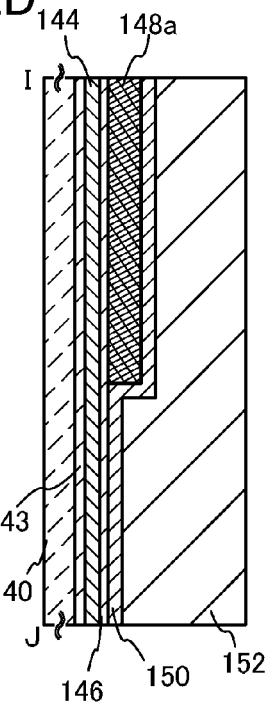
Figure 2C:
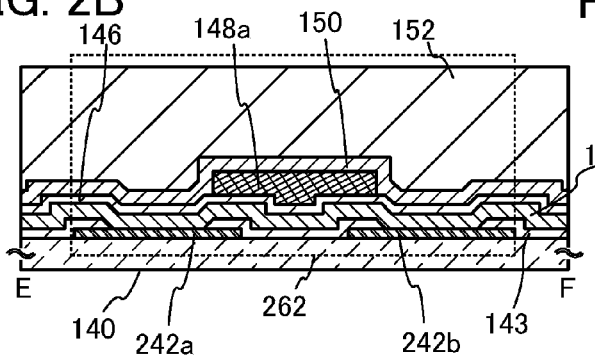
Figure 2D:
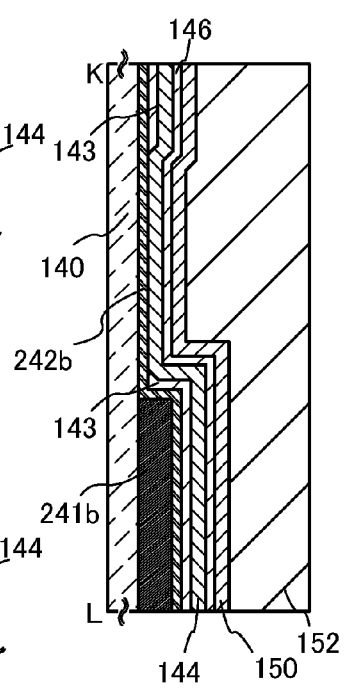
Figure 2E:
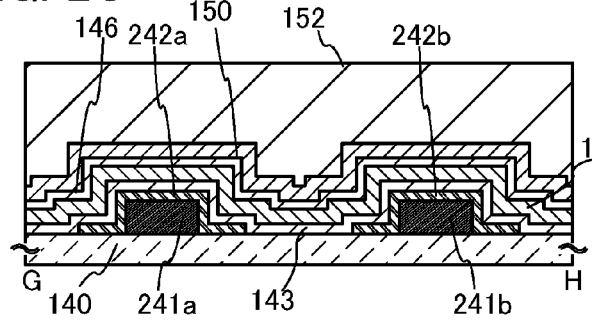

A transistor 262 in FIGS. 2A to 2E has a structure similar to that of the transistor 162. FIG. 2A is a top view of the transistor 262, and FIG. 2B is a cross-sectional view taken along a line E-F of FIG. 2A. FIG. 2C is a cross-sectional view taken along a line G-H of FIG. 2A. FIG. 2D is a cross-sectional view taken along a line I-J of FIG. 2A. FIG. 2E is a cross-sectional view taken along a line K-L of FIG. 2A.

The transistor 262 in FIGS. 2A to 2E includes, over the base 140 having a surface where components are formed, a source wiring including a first conductive layer 241a and a second conductive layer 242a, a drain wiring including a first conductive layer 241b and a second conductive layer 242b, the insulating layer 143 which has opening portions and is provided over the source and drain wirings, the oxide semiconductor layer 144 which is in contact with parts of the second conductive layers 242a and 242b in the opening portions and provided over the insulating layer 143, the gate insulating layer 146 covering the oxide semiconductor layer 144, and the gate electrode 148a over the gate insulating layer 146.

Further, the insulating layer 150 and the insulating layer 152 are provided to cover the gate insulating layer 146, the gate electrode 148a, and the like. However, the insulating layer 150 and the insulating layer 152 are not necessarily provided.

In the transistor 262 illustrated in FIGS. 2A to 2E, the second conductive layer 242a in the source wiring has a smaller thickness than the first conductive layer 241a and the second conductive layer 242b in the drain wiring has a smaller thickness than the first conductive layer 241b, which is similar to the transistor 162 illustrated in FIGS. 1A to 1C.

The difference between the transistor 262 of FIGS. 2A to 2E and the transistor 162 of FIGS. 1A to 1C lies in an arrangement of the source wiring and the drain wiring. In the case of the transistor 162, in the source wiring and the drain wiring, the region in contact with the oxide semiconductor layer is formed of a single layer of the second conductive layer with a small thickness, and the lead wiring is formed of the first conductive layer with a large thickness. On the other hand, in the case of the transistor 262, in the source wiring and the drain wiring, a region in contact with the oxide semiconductor layer is formed of a single layer of the second conductive layer with a small thickness, and the lead wiring is formed of a stacked layer of the second conductive layer and the first conductive layer with a large thickness. Note that the stacked order of the first conductive layer and the second conductive layer may be reversed.

The effect due to the structure of FIGS. 2A to 2E is similar to that of FIGS. 1A to 1C. That is, in the source wiring, the region formed of a single layer of the second conductive layer 242a with a small thickness has higher resistance than a region formed of a stacked layer of the first conductive layer 241a and the second conductive layer 242a, and in the drain wiring, the region formed of a single layer of the second conductive layer 242b with a small thickness has higher resistance than a region formed of the stacked layer of the first conductive layer 241b and the second conductive layer 242b. In the transistor 262, the second conductive layer 242a included in the source wiring is extended beyond an edge portion of the first conductive layer 241a in the channel width direction and has a high resistance region (a region formed of a single layer of the second conductive layer 242a). Similarly, the second conductive layer 242b included in the drain wiring is extended beyond an edge portion of the first conductive layer 241b in the channel width direction and has a high resistance region (a region formed of a single layer of the second conductive layer 241b).

The source wiring or the drain wiring of the transistor 262 in this high resistance region is in contact with the oxide semiconductor layer 144, whereby an electric field between the source and the drain can be relaxed, and a short channel effect due to miniaturization of the transistor can be suppressed. Further, since the second conductive layer 242a or 242b has a small thickness, the coverage with the gate insulating layer 146 provided over the oxide semiconductor layer 144 can be favorable. In addition, the oxide semiconductor layer 144 is in contact with part of a top surface of the source wiring or the drain wiring, and the coverage with the oxide semiconductor layer 144 can be favorable. Furthermore, in a source wiring (or a drain wiring), a region scanning in a direction parallel to the gate electrode 148a (the gate wiring) is formed of a single layer of the second conductive layer 242a (or 242b), whereby reduction in layout can be performed. In FIGS. 2A to 2E, a region functioning as a lead wiring of the source or drain wiring, through which voltage or current is supplied to the transistor 262, is formed using a stacked layer of the first conductive layer 241a with a large thickness and the second conductive layer 242a or a stacked layer of the first conductive layer 241b with a large thickness and the second conductive layer 242b. With such a structure, the wiring resistance of the lead wiring can be reduced.

Note that the second conductive layer 242a preferably has a larger length in the channel length direction than that of the first conductive layer 241a, and the second conductive layer 242b preferably has a larger length in the channel length direction than that of the first conductive layer 241b.

<Example of Manufacturing Method of Semiconductor Device>

Figures 1, 7A:
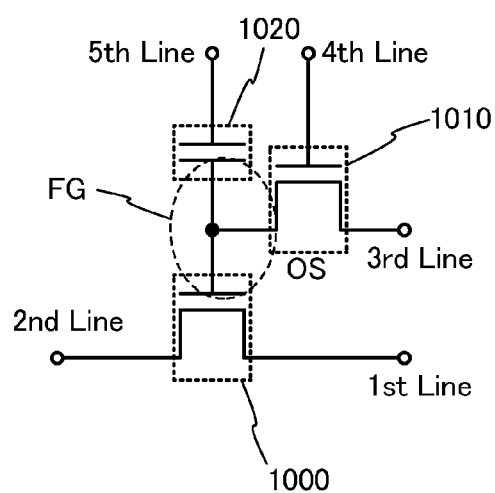
FIGS. 7A-1 and 7A-2 and 7B are circuit diagrams of a semiconductor device according to one embodiment of the disclosed invention.

Next, an example of a method for manufacturing the transistor 162 illustrated in FIGS. 1 to 1C is described with reference to FIGS. 3A to 3E. Note that the transistor 262 illustrated in FIGS. 2A to 2E can be manufactured in a manner similar to that of the transistor 162 of FIGS. 1A to 1C, other than arrangement of the source wiring and the drain wiring, and the manufacturing method of the transistor 262 can be referred to FIGS. 3A to 3E; thus, the detailed description thereof is omitted.

First, a first conductive layer is formed over the base 140 having a surface where components are formed and then selectively etched, so that the first conductive layers 141a and 141b are formed. A second conductive layer is formed over the first conductive layers 141a and 141b and then selectively etched, so that the second conductive layers 142a and 142b are formed. Thus, the source wiring in which the first conductive layer 141a and the second conductive layer 142a are stacked and the drain wiring in which the first conductive layer 141b and the second conductive layer 142b are stacked are formed (see FIG. 3A).

Note that there is no particular limitation on a substrate that can be used as the base 140 as long as it has at least heat resistance to withstand later heat treatment. For example, a glass substrate, a ceramic substrate, a quartz substrate, a sapphire substrate, or the like can be used. Alternatively, a single crystal semiconductor substrate or a polycrystalline semiconductor substrate of silicon, silicon carbide, or the like; a compound semiconductor substrate of silicon germanium or the like; an SOI substrate; or the like can be used as long as the substrate has an insulating surface. A semiconductor element may be provided over the substrate. Further, a base film may be provided over the base 140.

Note that the preferred surface of the base 140 where components are formed is a sufficiently flat surface. For example, a surface whose root-mean-square roughness (RMS) is less than or equal to 1 nm (preferably, less than or equal to 0.5 nm) is employed. The transistor 162 is formed over such a surface, whereby the characteristics can be sufficiently enhanced. In the case where the surface of the base 140 has poor flatness, it is desirable that the surface be subjected to chemical mechanical polishing (CMP) treatment or etching treatment so as to have the above flatness.

The first conductive layer can be formed by a PVD method typified by a sputtering method, or a CVD method such as a plasma CVD method. The thickness of the first conductive layer is larger than or equal to 50 nm and smaller than or equal to 500 nm, for example. As a material of the first conductive layer, an element selected from aluminum, chromium, copper, tantalum, titanium, molybdenum, and tungsten, a nitride thereof, an alloy containing any of the above elements as its component, or the like can be used. Moreover, one or more materials selected from manganese, magnesium, zirconium, and beryllium may be used. Alternatively, aluminum combined with one or more of elements selected from titanium, tantalum, tungsten, molybdenum, chromium, neodymium, and scandium may be used. Note that the first conductive layer is preferably formed using a material with higher conductivity than that of the second conductive layer, and for example, titanium, titanium nitride, or the like is preferably used. Using a material with high conductivity for the lead wiring can make the transistor operate at high speed.

The first conductive layer may have a single-layer structure or a stacked-layer structure including two or more layers. For example, a single-layer structure of a titanium film, a single-layer structure of an aluminum film containing silicon, a two-layer structure in which a titanium film is stacked over an aluminum film, a three-layer structure in which a titanium film, an aluminum film, and a titanium film are stacked in this order, and the like can be given. Note that in the case where the first conductive layer has a single-layer structure, there is an advantage that the first conductive layer can be easily processed into the source and drain wirings each having a tapered shape.

The first conductive layer may be formed using a conductive metal oxide. The conductive metal oxide can be indium oxide ($In_2O_3$), tin oxide ($SnO_2$), zinc oxide (ZnO), an indium oxide-tin oxide alloy ($In_2O_3$—$SnO_2$, which may be abbreviated to ITO), an indium oxide-zinc oxide alloy ($In_2O_3$—ZnO), or any of these metal oxide materials including silicon or silicon oxide.

The thickness of the second conductive layer is preferably larger than or equal to 10 nm and smaller than or equal to 15 nm. The second conductive layer can be formed using a material and a method similar to those of the first conductive layer. The second conductive layer may have either a single-layer structure or a stacked-layer structure including two or more layers. In the case of employing a stacked-layer structure for the second conductive layer, the total thickness of the stacked layer is preferably larger than or equal to 10 nm and smaller than or equal to 15 nm.

Note that in the case where the first conductive layer (or the second conductive layer) has a stacked-layer structure, the layers stacked are collectively referred to as the first conductive layer (or the second conductive layer). For example, the description "a region formed of a single layer of the first conductive layer" includes the region formed of the first conductive layer which has a stacked-layer structure, in some cases.

As a material of the second conductive layer, a metal material having a higher work function than the oxide semiconductor layer formed later is preferably used because the resistance of a contact interface between the second conductive layer and the oxide semiconductor layer can be increased. Examples of such metal materials are gold, platinum, tungsten nitride, and an indium oxide-tin oxide alloy. Further, a material having higher resistance than the first conductive layer is preferably used for the second conductive layer, whereby in the source wiring and the drain wiring of the transistor 162, a region which is contact with the oxide semiconductor layer has higher resistance than the other region; accordingly, an electric field between the source and the drain is relaxed and a short channel effect can be suppressed. The second conductive layer functions as one part of the source wiring or the drain wiring and is in contact with the oxide semiconductor layer; thus, a material which does not cause a chemical reaction by being contact with the oxide semiconductor layer is preferably used for the second conductive layer.

Although either dry etching or wet etching may be performed as the etching of the first or second conductive layer, dry etching with high controllability is preferably used for miniaturization. The etching may be performed so that the source wiring and the drain wiring to be formed have a tapered shape. Here, the taper angle is greater than or equal to 30° and less than or equal to 60°, for example.

The channel length (L) of the transistor 162 may be determined by a space between an upper edge portion of the second conductive layer 142a and an upper edge portion of the second conductive layer 142b. A reduction in the channel length (L) of the transistor enables operation speed of the circuit to increase. Moreover, the reduction can lead to low power consumption of a semiconductor device. Note that for light exposure for forming a mask used in the case where a transistor with a channel length (L) that is smaller than 25 nm is formed, it is preferable to use extreme ultraviolet rays whose wavelength is as short as several nanometers to several tens of nanometers. In the light exposure with extreme ultraviolet light, the resolution is high and the focal depth is large. Therefore, the channel length (L) of a transistor, which is formed later, can also be smaller than 2 μm, preferably, larger than or equal to 10 nm and smaller than or equal to 350 nm (0.35 μm).

Figure 3A:
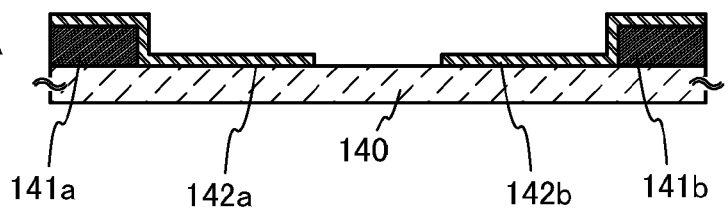
FIGS. 3A to 3E are cross-sectional views illustrating a manufacturing process of a semiconductor device.
Figure 3B:
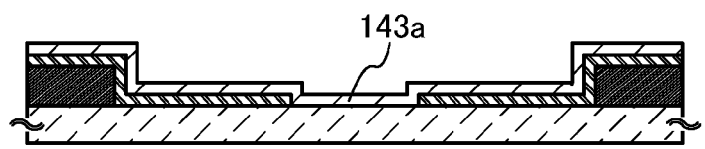

Next, an insulating layer 143a is formed to cover the source wiring and the drain wiring (see FIG. 3B).

The insulating layer 143a can be formed using a material including an inorganic insulating material such as silicon oxide, silicon oxynitride, silicon nitride, or aluminum oxide. It is particularly preferable that the insulating layer 143a be formed using silicon oxide because the oxide semiconductor layer 144 formed later is in contact with the insulating layer 143a. Although there is no particular limitation on the forming method of the insulating layer 143a, in consideration of contact with the oxide semiconductor layer 144, a method in which hydrogen is sufficiently reduced is preferably employed. Examples of such a method include a sputtering method and the like. Needless to say, another deposition method such as a plasma CVD method may be used. The preferred thickness of the insulating layer 143a is 15 nm to 20 nm.

Figure 3C:
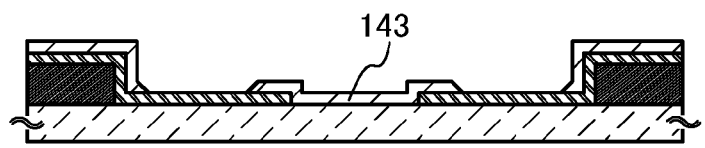

Next, the insulating layer 143a in regions overlapping with the second conductive layer 142a and the second conductive layer 142b is selectively removed, so that the insulating layer 143 having opening portions reaching the second conductive layer 142a and the second conductive layer 142b is formed (see FIG. 3C). The selective removal of the insulating layer 143a can be performed by a method such as etching.

As a method for etching the insulating layer 143a, either dry etching or wet etching may be employed. Further, the insulating layer 143a is preferably etched so that the opening portions to be formed have an inclined surface. The inclined surface preferably has an angle formed with the surface of the base 140 and the inclined surface greater than or equal to 30° and less than or equal to 60° when seen from a direction perpendicular to a cross section (a plane perpendicular to the surface of the base 140) of the inclined surface. By etching the insulating layer 143a under such a condition, coverage with the oxide semiconductor layer to be formed later to cover the insulating layer 143 is increased, so that disconnection of the oxide semiconductor layer or the like can be prevented.

When part of the source wiring or the drain wiring (specifically, part of a top surface of the second conductive layer) is in contact with the oxide semiconductor layer formed later in the opening portion provided in the insulating layer 143, the contact area where the source or drain wiring is in contact with the oxide semiconductor layer can be drastically reduced. Therefore, the contact resistance at the contact interface can be increased. Further, the area of the opening portion is approximately equal to the contact area; thus, the contact area can be easily controlled. That is, the resistance of the source wiring or the drain wiring can be easily controlled, and a short channel effect can be efficiently suppressed. Further, the source wiring and the drain wiring in a region other than the part in contact with the oxide semiconductor layer are covered with the insulating layer 143, whereby leakage of undesired current passing can be suppressed.

Next, the oxide semiconductor layer 144 is formed over the insulating layer 143 by a sputtering method to be in contact with the second conductive layers 142a and 142b in the opening portions. Then, the gate insulating layer 146 is formed to cover the oxide semiconductor layer 144 (see FIG. 3D).

As the oxide semiconductor layer 144, the following metal oxide can be used: an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which is a three-component metal oxide; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor layer which is a two-component metal oxide; an In—O-based oxide semiconductor, a Sn—O-based oxide semiconductor, or a Zn—O-based oxide semiconductor which is a single-component metal oxide; or the like.

In particular, an In—Ga—Zn—O-based oxide semiconductor material has sufficiently high resistance when there is no electric field and thus off-state current can be sufficiently reduced. In addition, the In—Ga—Zn—O-based oxide semiconductor material has high field-effect mobility and thus is suitable for a semiconductor device.

As a typical example of the In—Ga—Zn—O-based oxide semiconductor material, one represented by $InGaO_3(ZnO)_m$ (m>0) is given. Using M instead of Ga, there is an oxide semiconductor material represented by $1$ $nMO_3(ZnO)_m$ (m>0). Here, M denotes one or more metal elements selected from gallium (Ga), aluminum (Al), iron (Fe), nickel (Ni), manganese (Mn), cobalt (Co), or the like. For example, M can be Ga, Ga and Al, Ga and Fe, Ga and Ni, Ga and Mn, Ga and Co, or the like. Note that the above-described compositions are derived from the crystal structures that the oxide semiconductor material can have and are only examples.

In the case where an In—Zn—O-based material is used as an oxide semiconductor, a target thereof has a composition ratio of In:Zn=50:1 to 1:2 in an atomic ratio ($In_2O_3$: ZnO=25:1 to 1:4 in a molar ratio), preferably, In:Zn=20:1 to 1:1 in an atomic ratio ($In_2O_3$: ZnO=10:1 to 1:2 in a molar ratio), further preferably, In:Zn=15:1 to 1.5:1 in an atomic ratio ($In_2O_3$: ZnO=15:2 to 3:4 in a molar ratio). For example, in a target used for formation of an In—Zn—O-based oxide semiconductor which has an atomic ratio of In:Zn:O=X:Y:Z, the relation of Z>(1.5X+Y) is satisfied.

As a target for forming the oxide semiconductor layer 144 by a sputtering method, a target having a composition ratio of In:Ga:Zn=1: x: y (x is 0 or more and y is more than or equal to 0.5 and less than or equal to 5) is preferably used. For example, a target having a composition ratio of In:Ga:Zn=1: 1:1 [atomic ratio] (x=1, y=1) (that is, $In_2O_3$:$Ga_2O_3$:ZnO=1: 1:2 [molar ratio]) can be used. Alternatively, the following targets can be also used: a target having a composition ratio of In:Ga:Zn=1:1:0.5 [atomic ratio] (x=1, y=0.5); a target having a composition ratio of In:Ga:Zn=1:1:2 [atomic ratio] (x=1, y=2); or a target having a composition ratio of In:Ga:Zn=1: 0:1 [atomic ratio] (x=0, y=1).

In this embodiment, the oxide semiconductor layer 144 having an amorphous structure is formed by a sputtering method using an In—Ga—Zn—O-based metal oxide target. The thickness thereof is larger than or equal to 1 nm and smaller than or equal to 50 nm, preferably, larger than or equal to 2 nm and smaller than or equal to 20 nm, further preferably, larger than or equal to 3 nm and smaller than or equal to 15 nm. By employing the transistor structure of this embodiment, a short channel effect due to miniaturization can be suppressed even when the oxide semiconductor layer 144 with the above thickness is used. Note that an appropriate thickness differs depending on an oxide semiconductor material used, the usage of a semiconductor device, or the like; therefore, it is also possible to set the thickness as appropriate depending on the material to be used, the usage, or the like. Note that in one embodiment of the disclosed invention, the oxide semiconductor layer 144 is in contact with part of the tope surface of the source wiring or the drain wiring. Therefore, even in the case where the oxide semiconductor layer has a small thickness, the coverage therewith can be favorable.

It is preferable that a metal oxide contained in the metal oxide target have a relative density of 80% or higher, preferably 95% or higher, further preferably 99.9% or higher. The use of the metal oxide target having high relative density makes it possible to form the oxide semiconductor layer having a dense structure.

The atmosphere in which the oxide semiconductor layer 144 is formed is preferably a rare gas (typically argon) atmosphere, an oxygen atmosphere, or a mixed atmosphere of a rare gas (typically argon) and oxygen. Specifically, it is preferable to use a high-purity gas atmosphere, for example, from which an impurity such as hydrogen, water, a hydroxyl group, or hydride is removed to a concentration of 1 ppm or lower (preferably, 10 ppb or lower).

In forming the oxide semiconductor layer 144, for example, an object to be processed is held in a treatment chamber that is kept under reduced pressure and the object to be processed is heated so that the temperature of the object to be processed is higher than or equal to 100° C. and lower than 550° C., preferably higher than or equal to 200° C. and lower than or equal to 400° C. Alternatively, the temperature of the object in the formation of the oxide semiconductor layer 144 may be room temperature (25° C.±10° C.). Then, a sputtering gas from which hydrogen, water, or the like is removed is introduced while moisture in the treatment chamber is removed, whereby the oxide semiconductor layer 144 is formed using the above-described target. By forming the oxide semiconductor layer 144 while heating the object to be processed, impurities in the oxide semiconductor layer 144 can be reduced. Moreover, damage due to sputtering can be reduced. In order to remove moisture in the treatment chamber, an entrapment vacuum pump is preferably used. For example, a cryopump, an ion pump, a titanium sublimation pump, or the like can be used. A turbo pump provided with a cold trap may be used. With the use of a cryopump or the like, hydrogen, water, and the like can be removed from the treatment chamber; thus, the concentration of impurities in the oxide semiconductor layer can be reduced.

The oxide semiconductor layer 144 can be formed under the following conditions, for example: the distance between the object to be processed and the target is 170 mm, the pressure is 0.4 Pa, the direct current (DC) power is 0.5 kW, and the atmosphere is an oxygen (oxygen: 100%) atmosphere, an argon (argon: 100%) atmosphere, or a mixed atmosphere containing oxygen and argon. Note that it is preferable to use a pulsed direct-current (DC) power source with which dusts (such as powder substances formed at the time of the film formation) can be reduced and the film thickness can be uniform.

Note that before the oxide semiconductor layer 144 is formed by a sputtering method, a material attached to a surface over which the oxide semiconductor layer 144 is formed (e.g., a surface of the insulating layer 143) may be removed by reverse sputtering in which an argon gas is introduced and plasma is generated. Here, the reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface to be processed in an argon atmosphere so that plasma is generated in the vicinity of the object to be processed. Note that an atmosphere of nitrogen, helium, oxygen, or the like may be used instead of an argon atmosphere.

After formation of the oxide semiconductor layer 144, heat treatment (first heat treatment) is preferably performed on the oxide semiconductor layer 144. By the first heat treatment, excessive hydrogen (including water and a hydroxyl group) in the oxide semiconductor layer 144 can be removed, the structure of the oxide semiconductor layer 144 can be modified, and defect levels in the energy gap can be reduced. The temperature of the first heat treatment is, for example, higher than or equal to 300° C. and lower than 550° C., or higher than or equal to 400° C. and lower than or equal to 500° C.

The heat treatment can be performed in such a way that, for example, an object to be heated is introduced into an electric furnace provided with a resistance heating element or the like and heated, under a nitrogen atmosphere at 450° C. for an hour. During the heat treatment, the oxide semiconductor layer is not exposed to the atmosphere to prevent the entry of water and hydrogen.

A heat treatment apparatus is not limited to the electric furnace and may be an apparatus for heating an object by thermal radiation or thermal conduction from a medium such as a heated gas. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the first heat treatment, a GRTA process may be performed as follows. The object is put in an inert gas atmosphere that has been heated, heated for several minutes, and taken out from the inert gas atmosphere. The GRTA process enables high-temperature heat treatment for a short time. Moreover, the GRTA process can be employed even when the temperature exceeds the upper temperature limit of the object. Note that the inert gas may be switched to a gas including oxygen during the process. This is because defect level in energy gap due to oxygen deficiency can be reduced by performing the first heat treatment in an atmosphere containing oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is greater than or equal to 6 N (99.9999%), preferably greater than or equal to 7 N (99.99999%) (that is, the concentration of the impurities is less than or equal to 1 ppm, preferably less than or equal to 0.1 ppm).

In any case, impurities are reduced by the first heat treatment so that an i-type (intrinsic) or substantially i-type oxide semiconductor layer is obtained. Accordingly, a transistor having highly excellent characteristics can be achieved.

The above heat treatment (first heat treatment) can be referred to as dehydration treatment, dehydrogenation treatment, or the like because of its effect of removing hydrogen, water, or the like. The dehydration treatment or the dehydrogenation treatment can also be performed at the following timing: after the formation of the oxide semiconductor layer 144, after the formation of the gate insulating layer 146, after the formation of the gate electrode, or the like. Such dehydration treatment or dehydrogenation treatment may be conducted only once or plural times.

After the oxide semiconductor layer 144 is formed, the oxide semiconductor layer 144 may be processed into an island-shaped oxide semiconductor layer, for example, by etching. The etching of the oxide semiconductor layer may be performed either before the heat treatment or after the heat treatment. Although dry etching is preferred in terms of element miniaturization, wet etching may be used. An etching gas and an etchant can be selected as appropriate depending on a material of layers to be etched.

The gate insulating layer 146 can be formed by a CVD method, a sputtering method, or the like. The gate insulating layer 146 is preferably formed so as to contain silicon oxide, silicon nitride, silicon oxynitride, aluminum oxide, tantalum oxide, hafnium oxide, yttrium oxide, hafnium silicate (HfSi$_x$O$_y$ (x>0, y>0)), hafnium silicate (HfSi$_x$O$_y$ (x>0, y>0)) to which nitrogen is added, hafnium aluminate (HfAl$_x$O$_y$ (x>0, y>0)) to which nitrogen is added, or the like. The gate insulating layer 146 may have a single-layer structure or a stacked structure. There is no particular limitation on the thickness; however, in the case where a semiconductor device is miniaturized, the thickness is preferably small for ensuring operation of the transistor. For example, in the case where silicon oxide is used, the thickness can be set to larger than or equal to 1 nm and smaller than or equal to 100 nm, preferably larger than or equal to 10 nm and smaller than or equal to 50 nm.

When the gate insulating layer is thin as in the above description, a problem of gate leakage due to a tunnel effect or the like is caused. In order to solve the problem of gate leakage, it is preferable that the gate insulating layer 146 be formed using a high dielectric constant (high-k) material such as hafnium oxide, tantalum oxide, yttrium oxide, hafnium silicate (HfSi$_x$O$_y$ (x>0, y>0)), hafnium silicate (HfSi$_x$O$_y$ (x>0, y>0)) to which nitrogen is added, or hafnium aluminate (HfAl$_x$O$_y$ (x>0, y>0)) to which nitrogen is added. By using a high-k material for the gate insulating layer 146, the thickness can be large to prevent gate leakage while electric characteristics can also be ensured. For example the relative dielectric constant of the hafnium oxide is approximately 15, which is much higher than that of silicon oxide which is 3 to 4. With such a material, a gate insulating layer where the silicon oxide equivalent oxide thickness is smaller than 15 nm, preferably larger than or equal to 2 nm and smaller than or equal to 10 nm can be easily formed. Note that a stacked structure of a film containing a high-k material and a film containing any of silicon oxide, silicon nitride, silicon oxynitride, silicon nitride oxide, aluminum oxide, and the like may be employed.

After the gate insulating layer 146 is formed, second heat treatment is desirably performed in an inert gas atmosphere or an oxygen atmosphere. The temperature of the heat treatment is set to be higher or equal to 200° C. and lower than or equal to 450° C., preferably higher than or equal to 250° C. and lower than or equal to 350° C. For example, the heat treatment may be performed at 250° C. for an hour in a nitrogen atmosphere. The second heat treatment can reduce variation in electric characteristics of the transistor. Further, in the case where the gate insulating layer 146 contains oxygen, oxygen is supplied to the oxide semiconductor layer 144 to cover oxygen deficiency in the oxide semiconductor layer 144, so that an i-type (intrinsic semiconductor) or substantially i-type oxide semiconductor layer can be formed.

Note that, although the second heat treatment is performed after the gate insulating layer 146 is formed in this embodiment, the timing of the second heat treatment is not limited thereto. For example, the second heat treatment may be performed after the gate electrode is formed. Alternatively, the second heat treatment may be performed following the first heat treatment, the first heat treatment may serve as the second heat treatment, or the second heat treatment may serve as the first heat treatment.

As described above, the oxide semiconductor layer 144 can be highly purified by applying at least one of the first heat treatment and the second heat treatment so that impurities contained other than a main component is contained as little as possible.

Figure 3D:
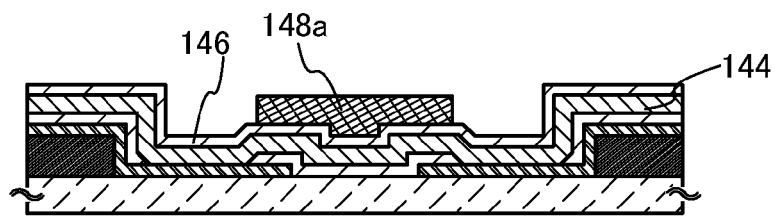

Next, the gate electrode 148a is formed over the gate insulating layer 146 (see FIG. 3D).

The gate electrode 148a can be formed in such a manner that a conductive layer is formed over the gate insulating layer 146 and then selectively etched. The conductive layer to be the gate electrode 148a can be formed by a PVD method typified by a sputtering method or a CVD method such as a plasma CVD method. Detailed formation is similar to formation of the first conductive layer or the second conductive layer, or the like; thus, the description thereof can be referred thereto.

Although in FIG. 3D, a structure in which parts of the second conductive layer 142a and the second conductive layer 142b overlap with the gate electrode 148a is illustrated, an embodiment of the disclosed invention is not limited thereto. For example, a structure in which an end portion of the second conductive layer 142a and/or an end portion of the second conductive layer 142b are substantially aligned with end portions of the gate electrode 148a (i.e., the channel length (L) and the length in the channel direction of the gate electrode 148a are substantially aligned) can be employed. Further, the oxide semiconductor layer 144, the gate insulating layer 146, or the gate electrode 148a is processed to have a curved end portion by etching or the like, whereby the coverage can be further increased.

Figure 3E:
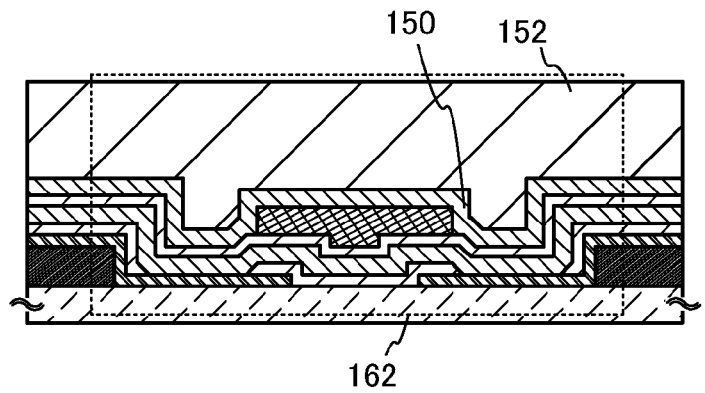

Next, the insulating layer 150 and the insulating layer 152 are formed to cover the gate insulating layer 146, the gate electrode 148a, and the like (see FIG. 3E). The insulating layer 150 and the insulating layer 152 can be formed by a PVD method, a CVD method, or the like. The insulating layer 150 and the insulating layer 152 can be formed using a material including an inorganic insulating material such as silicon oxide, silicon oxynitride, silicon nitride, hafnium oxide, or aluminum oxide.

Note that the insulating layer 150 and the insulating layer 152 are preferably formed using a low dielectric constant material or to have a structure with low dielectric constant (e.g., a porous structure). The dielectric constant of the insulating layer 150 and the insulating layer 152 is reduced, whereby the capacitance generated between wirings or electrodes can be reduced, which results in higher speed operation.

Note that, although a stacked-layer structure of the insulating layer 150 and the insulating layer 152 is employed in this embodiment, one embodiment of the disclosed invention is not limited thereto. A single-layer structure or a stacked structure including three or more layers can also be used. Alternatively, the insulating layer may be omitted.

Note that the insulating layer 152 is preferably formed so as to have a flat surface. By forming the insulating layer 152 having a flat surface, an electrode, a wiring, or the like can be favorably formed over the insulating layer 152 even in the case where the semiconductor device is miniaturized, for example. The insulating layer 152 can be flattened by a method such as chemical mechanical polishing (CMP).

Through the above steps, the transistor 162 including the highly purified oxide semiconductor layer 144 is completed.

Note that after the above steps, a variety of wirings, electrodes, or the like may be formed. The wirings or the electrodes can be formed by a so-called damascene method or dual damascene method, or the like.

As described above, according to one embodiment of the disclosed invention, the regions in the source wiring and the drain wiring which are in contact with the oxide semiconductor layer are each a high resistance region (specifically, the region is in contact with the oxide semiconductor layer in the opening portion provided in the insulating layer, whereby the contact area is reduced, and the region is formed of a single layer of the second conductive layer with a small thickness), so that an electric field between the source and the drain is relaxed and the coverage with the oxide semiconductor layer is increased. On the other hand, as a wiring led for connection with an external circuit (hereinafter, a lead wiring), the first conductive layer with a large thickness or a stacked layer of the first conductive layer and the second conductive layer is used, whereby the wiring resistance of the lead wiring is reduced.

Further, according to one embodiment of the disclosed invention, the insulating layer 143 is provided to fill a space between the second conductive layer 142a and the second conductive layer 142b which are provided to be apart from each other, whereby leakage of undesired current passing can be suppressed.

Furthermore, by increasing coverage with the oxide semiconductor layer 144, disconnection, poor connection, or the like of the oxide semiconductor layer 144 can be prevented; accordingly, the transistor 162 having favorable characteristics can be provided.

In the transistor 162 described in this embodiment, the oxide semiconductor layer 144 is highly purified and thus the hydrogen concentration thereof is lower than or equal to $5 \times 10^{19}$ atoms/cm$^3$, preferably lower than or equal to $5 \times 10^{18}$ atoms/cm$^3$, further preferably lower than or equal to $5 \times 10^{17}$ atoms/cm$^3$. In addition, the carrier density due to a donor such as hydrogen of the oxide semiconductor layer 144 is, for example, lower than $1 \times 10^{12}$/cm$^3$, preferably lower than $1.45 \times 10^{10}$/cm$^3$, which is sufficiently lower than the carrier density of a general silicon wafer (approximately $1 \times 10^{14}$/cm$^3$). Accordingly, the off-state current of the transistor 162 is also sufficiently reduced. For example, the off-state current (here, current per micrometer (μm) of channel width) of the transistor 162 at room temperature (25° C.) is less than or equal to 100 zA (1 zA (zeptoampere) is $1 \times 10^{-21}$ A), preferably less than or equal to 10 zA. Note that when the above structure is employed, the off-state current of the transistor can be $1 \times 10^{-24}$ A/μm to $1 \times 10^{-30}$ A/μm in theory.

With use of the intrinsic oxide semiconductor layer 144 which is highly purified, the off-state current of the transistor can be sufficiently reduced.

The structures, methods, and the like described in this embodiment can be combined as appropriate with any of the structures, methods, and the like described in the other embodiments.

Embodiment 2

In this embodiment, a structure and a manufacturing method of a semiconductor device according to one embodiment of the disclosed invention will be described with reference to FIGS. 4A to 4C, FIGS. 5A to 5D, and FIGS. 6A to 6C.

<Structural Example of Semiconductor Device>

Figure 4A:
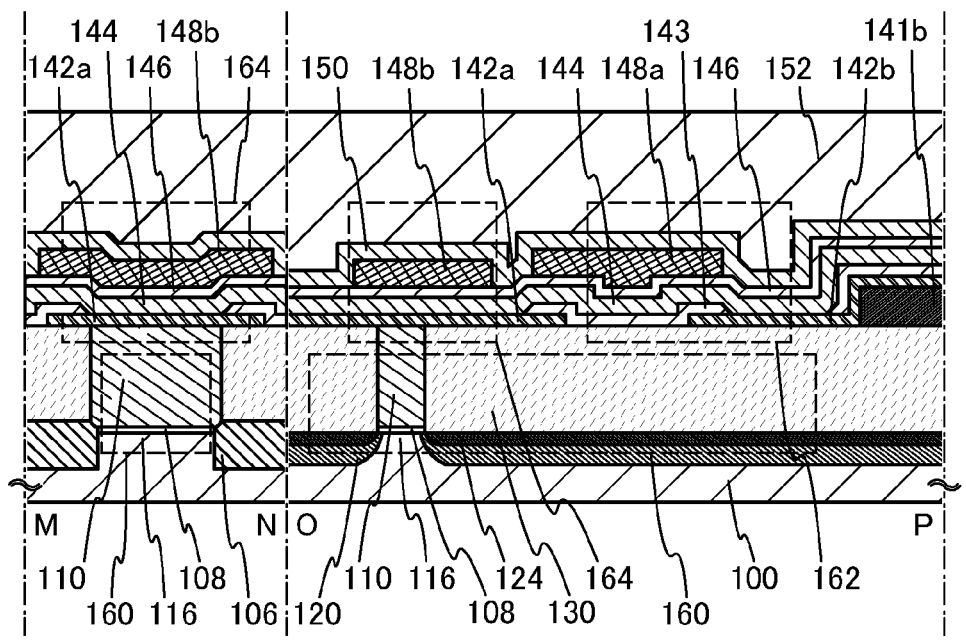
FIGS. 4A to 4C are a top view of a semiconductor device, a cross-sectional view thereof, and a circuit diagram thereof, respectively.
Figure 4B:
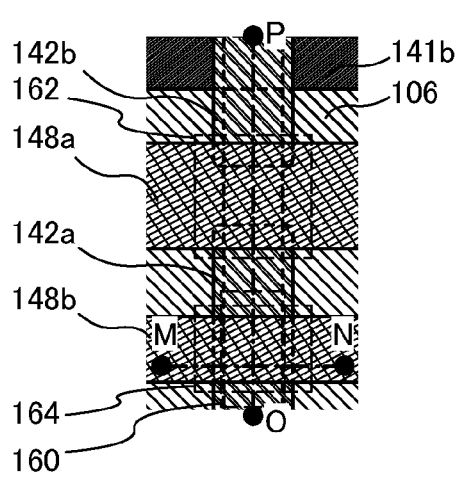
Figure 4C:
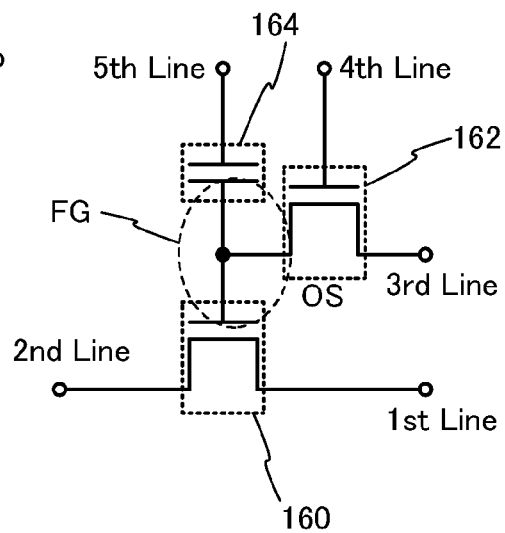

FIGS. 4A to 4C illustrate an example of a structure of a semiconductor device. FIG. 4A is a cross-sectional view of the semiconductor device, FIG. 4B is a top view of the semiconductor device, and FIG. 4C is a circuit diagram of the semiconductor device. Note that a structure of the semiconductor device is mainly described in this embodiment, and operation of the semiconductor device will be described in detail in an embodiment below. Note that the semiconductor device illustrated in FIGS. 4A to 4C is just an example having the predetermined functions and does not perfectly represent a semiconductor device according to the disclosed invention. The semiconductor device according to the disclosed invention can have another function by changing connection relation of electrodes or the like as appropriate.

FIG. 4A corresponds to a cross-sectional view taken along lines M-N and O-P of FIG. 4B. The semiconductor device illustrated in FIGS. 4A and 4B includes, in addition to the transistor 162 described in the above embodiment, a capacitor 164 and a transistor 160 positioned below the transistor 162.

Here, it is preferable that a semiconductor material of the transistor 162 and a semiconductor material of the transistor 160 be different from each other. For example, the semiconductor material of the transistor 162 can be an oxide semiconductor, and the semiconductor material of the transistor 160 can be a semiconductor material such as silicon other than an oxide semiconductor. The transistor including an oxide semiconductor can hold electric charge for a long time owing to its characteristics. On the other hand, a transistor including a material other than an oxide semiconductor can operate at high speed easily.

The transistor 160 in FIGS. 4A to 4C includes a channel formation region 116 provided in a substrate 100 including a semiconductor material (such as silicon), impurity regions 120 provided so that the channel formation region 116 is sandwiched therebetween, metal compound regions 124 in contact with the impurity regions 120, a gate insulating layer 108 provided over the channel formation region 116, and a gate electrode 110 provided over the gate insulating layer 108. Note that a transistor whose source electrode and drain electrode are not illustrated explicitly in the drawing may be referred to as a transistor for the sake of convenience. Further, in such a case, in description of a connection between transistors, a source region and a source electrode may be collectively referred to as a source electrode and a drain region and a drain electrode may be collectively referred to as a drain electrode. That is, in this specification, the term "source electrode" may include a source region.

An element isolation insulating layer 106 is provided over the substrate 100 to surround the transistor 160. An insulating layer 130 is provided to cover the transistor 160. Note that for high integration, it is preferable that, as in FIGS. 4A to 4C, the transistor 160 does not have a sidewall insulating layer. On the other hand, when importance is put on the characteristics of the transistor 160, sidewall insulating layers may be provided on side surfaces of the gate electrode 110, and the impurity regions 120 may include a region having a different impurity concentration.

The transistor 162 in FIGS. 4A to 4C has a structure similar to that of the transistor 162 in the above embodiment. However, in this embodiment, the second conductive layer 142a of the source wiring (or the second conductive layer 142b of the drain wiring) of the transistor 162 and the gate electrode 110 of the transistor 160 are connected. Needless to say, the transistor 262 can be used instead of the transistor 162.

The capacitor 164 in FIGS. 4A to 4C includes the second conductive layer 142a, the oxide semiconductor layer 144, the gate insulating layer 146, and an electrode 148b. That is to say, the second conductive layer 142a functions as one of electrodes of the capacitor 164, and the electrode 148b functions as the other electrode of the capacitor 164. Note that the electrode 148b is formed by a method similar to that of the gate electrode 148a of the transistor 162.

Note that in the capacitor 164 illustrated in FIGS. 4A to 4C, insulation between the second conductive layer 142a and the electrode 148b can be adequately secured by stacking the oxide semiconductor layer 144 and the gate insulating layer 146. It is needless to say that the capacitor 164 without the oxide semiconductor layer 144 may be employed in order to secure sufficient capacitance. Further alternatively, the capacitor 164 may be omitted in the case where a capacitance is not needed.

In this embodiment, the transistor 162 and the capacitor 164 are provided so as to overlap with the transistor 160. By employing such a planar layout, high integration is possible. For example, given that the minimum feature size is F, the area occupied by the semiconductor device can be 15 $F^2$ to 25 $F^2$.

Note that a structure of the semiconductor device according to the disclosed invention is not limited to that illustrated in FIGS. 4A to 4C. Since the spirit of techniques of the disclosed invention is to form a stacked-layer structure including an oxide semiconductor and a material other than an oxide semiconductor, the details of connection relation of electrodes or the like can be changed as appropriate.

<Manufacturing Method of Semiconductor Device>

Next, an example of a method for manufacturing the aforementioned semiconductor device will be described with reference to FIGS. 5A to 5D and FIGS. 6A to 6C. Note that since a method for manufacturing the transistor 162 is similar to that described in above embodiment, a method for manufacturing the transistor 160 is mainly described here.

Figure 5A:
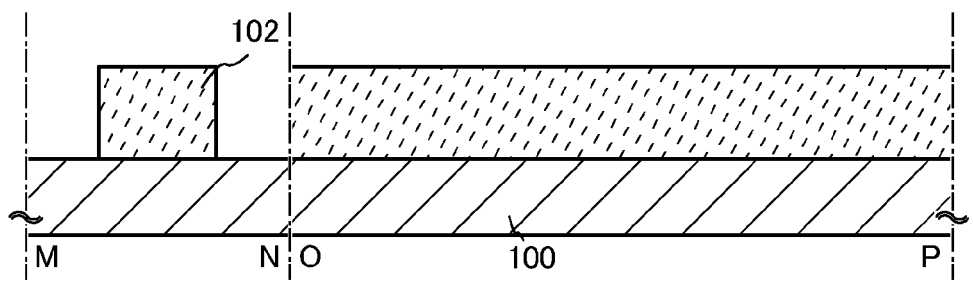
FIGS. 5A to 5D are cross-sectional views illustrating a manufacturing process of a semiconductor device.
Figure 5B:
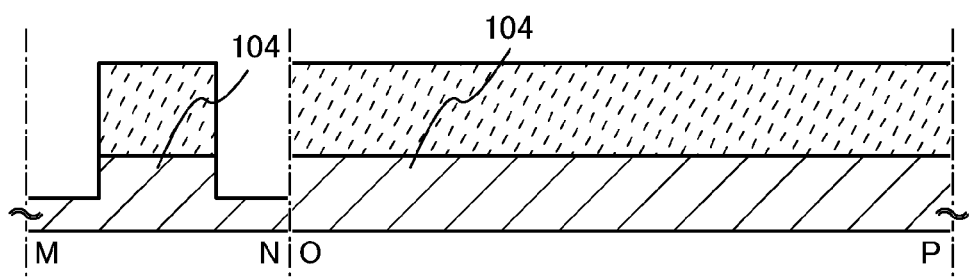

First, the substrate 100 including a semiconductor material is prepared (see FIG. 5A). As the substrate 100 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Here, an example of using a single crystal silicon substrate as the substrate 100 including a semiconductor material is described. Note that in general, the term "SOI substrate" means a substrate where a silicon semiconductor layer is provided on an insulating surface. In this specification and the like, the term "SOI substrate" also includes a substrate where a semiconductor layer formed using a material other than silicon is provided over an insulating surface in its category. That is, a semiconductor layer included in the "SOI substrate" is not limited to a silicon semiconductor layer. Moreover, the SOI substrate can be a substrate having a structure in which a semiconductor layer is provided over an insulating substrate such as a glass substrate, with an insulating layer interposed therebetween.

It is particularly preferable to use a single crystal semiconductor substrate of silicon or the like as the substrate 100 including a semiconductor material because the speed of reading operation of the semiconductor device can be increased.

In order to control the threshold voltage of the transistor, an impurity element may be added to a region which later functions as the channel formation region 116 of the transistor 160. Here, an impurity element imparting conductivity which makes the threshold voltage of the transistor 160 become a positive value is added. When the semiconductor material is silicon, boron, aluminum, gallium, or the like can be used as the above impurity imparting conductivity. Note that after addition of the impurity element, heat treatment is preferably performed so as to activate the impurity element, reduce defects caused by addition of the impurity element, or the like.

Next, over the substrate 100, a protective layer 102 which functions as a mask for forming an element isolation insulating layer is formed (see FIG. 5A). As the protective layer 102, an insulating layer formed using silicon oxide, silicon nitride, silicon oxynitride, or the like can be used, for example.

Next, part of the substrate 100 in a region that is not covered with the protective layer 102 (in an exposed region) is removed by etching with the use of the protective layer 102 as a mask. Thus, a semiconductor region 104 which is separated from another semiconductor region is formed (see FIG. 5B). As the etching, dry etching is preferable, but wet etching can be employed. An etching gas and an etchant can be selected as appropriate depending on a material of layers to be etched.

Figure 5C:
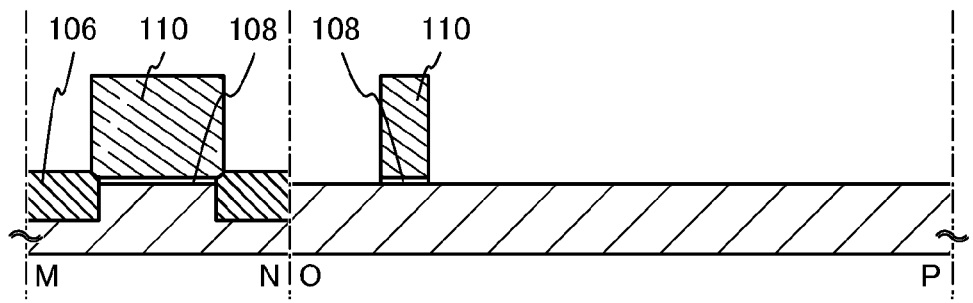

Next, an insulating layer is formed so as to cover the semiconductor region 104, and the insulating layer in a region overlapping with the semiconductor region 104 is selectively removed, whereby the element isolation insulating layers 106 are formed (see FIG. 5C). The insulating layer is formed using silicon oxide, silicon nitride, silicon oxynitride or the like. For removing the insulating layer, either of etching treatment or polishing treatment such as chemical mechanical polishing (CMP) can be employed. Note that the protective layer 102 is removed after the formation of the semiconductor region 104 or after the formation of the element isolation insulating layers 106.

Next, an insulating layer is formed on a surface of the semiconductor region 104, and a layer containing a conductive material is formed over the insulating layer.

The insulating layer is to be a gate insulating layer later, and may be formed by heat treatment (thermal oxidation treatment or thermal nitridation treatment) on the surface of the semiconductor region 104, for example. High-density plasma treatment may be employed instead of heat treatment. The high-density plasma treatment can be performed using, for example, a mixed gas of a rare gas such as He, Ar, Kr, or Xe and a gas such as oxygen, nitrogen oxide, ammonia, nitrogen, or hydrogen. Needless to say, the insulating layer may be formed by a CVD method, a sputtering method, or the like. The insulating layer preferably has a single-layer structure or a stacked-layer structure including a film which contains any of silicon oxide, silicon oxynitride, silicon nitride, hafnium oxide, aluminum oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, and the like. The insulating layer can have a thickness, for example, larger than or equal to 1 nm and smaller than or equal to 100 nm, preferably larger than or equal to 10 nm and smaller than or equal to 50 nm.

The layer containing a conductive material can be formed using a metal material such as aluminum, copper, titanium, tantalum, or tungsten. Alternatively, the layer containing a conductive material may be formed using a semiconductor material such as polycrystalline silicon. There is no particular limitation on the method for forming the layer containing a conductive material, and a variety of film deposition methods such as an evaporation method, a CVD method, a sputtering method, or a spin coating method can be employed. Note that this embodiment shows an example of the case where the layer containing a conductive material is formed using a metal material.

After that, the insulating layer and the layer containing a conductive material are selectively etched, so that the gate insulating layer 108 and the gate electrode 110 are formed (see FIG. 5C).

Figure 5D:
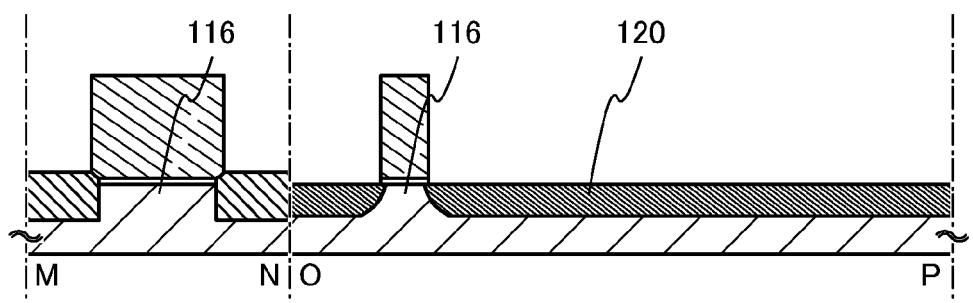

Then, phosphorus (P), arsenic (As), or the like is added to the semiconductor region 104, whereby the channel formation region 116 and an impurity region 120 are formed (see FIG. 5D). Note that phosphorus or arsenic is added here in order to form an n-channel transistor; an impurity element such as boron (B) or aluminum (Al) may be added in the case of forming a p-channel transistor. Here, the concentration of the impurity added can be set as appropriate; the concentration is preferably increased when the size of a semiconductor element is extremely decreased.

Note that sidewall insulating layers may be formed in the periphery of the gate electrode 110 to form impurity regions to which impurity elements are added at different concentrations.

Figure 6A:
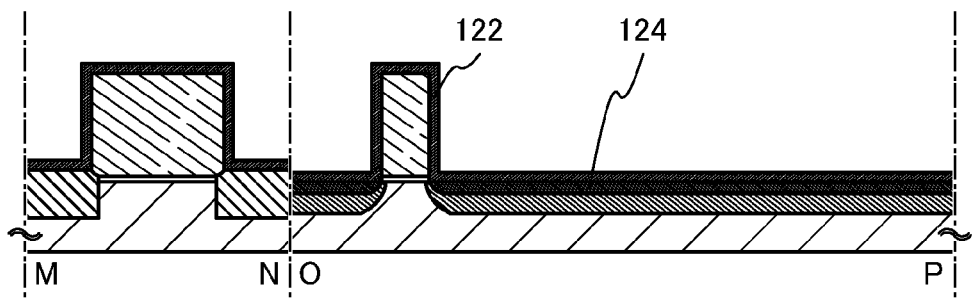
FIGS. 6A to 6C are cross-sectional views illustrating a manufacturing process of a semiconductor device.

Next, a metal layer 122 is formed so as to cover the gate electrode 110, the impurity regions 120, and the like (see FIG. 6A). A variety of film deposition methods such as a vacuum evaporation method, a sputtering method, or a spin coating method can be employed for forming the metal layer 122. The metal layer 122 is preferably formed using a metal material that reacts with a semiconductor material included in the semiconductor region 104 to be a low-resistance metal compound. Examples of such metal materials include titanium, tantalum, tungsten, nickel, cobalt, platinum, and the like.

Next, heat treatment is performed so that the metal layer 122 reacts with the semiconductor material. Thus, a metal compound region 124 which is in contact with the impurity region 120 is formed (see FIG. 6A). Note that when the gate electrode 110 is formed using polycrystalline silicon or the like, a metal compound region is also formed in a region of the gate electrode 110 in contact with the metal layer 122.

As the heat treatment, irradiation with a flash lamp can be employed, for example. Although it is needless to say that another heat treatment method may be used, a method by which heat treatment for an extremely short time can be achieved is preferably used in order to improve the controllability of chemical reaction in formation of the metal compound. Note that the metal compound regions are formed by reaction of the metal material and the semiconductor material and have sufficiently high conductivity. The formation of the metal compound regions can properly reduce the electric resistance and improve element characteristics. Note that the metal layer 122 is removed after the metal compound regions 124 are formed.

Figure 6B:
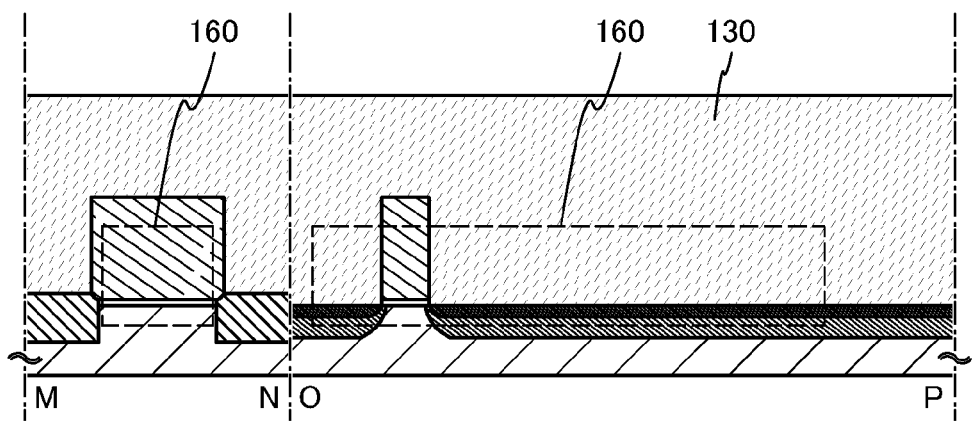

Then, the insulating layer 130 is formed so as to cover the components formed through the above steps (see FIG. 6B). The insulating layer 130 can be formed using a material including an inorganic insulating material such as silicon oxide, silicon oxynitride, silicon nitride, or aluminum oxide. It is particularly preferable to use a low dielectric constant (low-k) material for the insulating layer 130 because capacitance generated due to overlap of electrodes or wirings can be sufficiently reduced. Note that a porous insulating layer with such a material may be employed as the insulating layer 130. A porous insulating layer has lower dielectric constant than an insulating layer with high density; thus, capacitance due to electrodes or wirings can be further reduced. Moreover, the insulating layer 130 can be formed using an organic insulating material such as polyimide or acrylic. Note that although a single-layer structure of the insulating layer 130 is employed here, one embodiment of the disclosed invention is not limited to this. The insulating layer may have a stacked-layer structure including two or more layers.

Through the above steps, the transistor 160 is formed with use of the substrate 100 including a semiconductor material (see FIG. 6B). Such a transistor 160 is capable of operating at high speed. Therefore, by using the transistor as a reading transistor, data can be read at high speed.

Figure 6C:
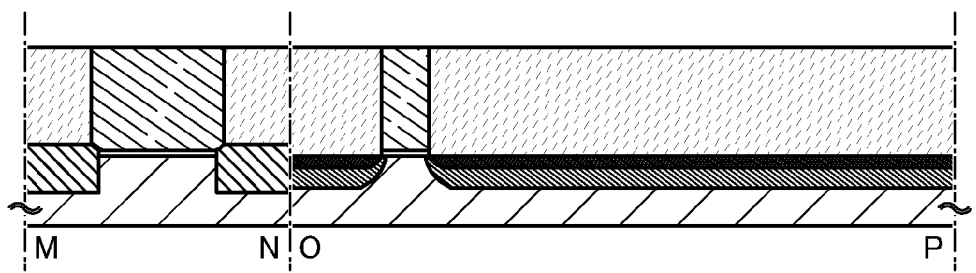

Then, as pretreatment for the formation of the transistor 162 and the capacitor 164, CMP treatment is performed on the insulating layer 130 to expose an upper surface of the gate electrode 110 (see FIG. 6C). As treatment for exposing the upper surface of the gate electrode 110, etching treatment, or the like can also be employed instead of CMP treatment; in order to improve characteristics of the transistor 162, a surface of the insulating layer 130 is preferably made as flat as possible.

Note that an electrode, a wiring, a semiconductor layer, an insulating layer, or the like may be further formed before and after the above steps. For example, a multilayer wiring structure in which an insulating layer and a conductive layer are stacked is employed as a wiring structure, whereby a highly-integrated semiconductor device can be achieved.

After that, the transistor 162 and the capacitor 164 are formed, whereby the semiconductor device is completed.

The structures, methods, and the like described in this embodiment can be combined as appropriate with any of the structures, methods, and the like described in the other embodiments.

Embodiment 3

In this embodiment, application examples of a semiconductor device according to one embodiment of the disclosed invention will be described with reference to FIGS. 7A-1, 7A-2, and 7B. Here, an example of a memory device is described. Note that in each of circuit diagrams, in some cases, "OS" is written beside a transistor in order to indicate that the transistor includes an oxide semiconductor.

In the semiconductor device capable of being used as a memory device illustrated in FIG. 7A-1, a first wiring (a 1st Line) is electrically connected to a source electrode of a transistor 1000 and a second wiring (a 2nd Line) is electrically connected to a drain electrode of the transistor 1000. A third wiring (a 3rd Line) is electrically connected to one of a source electrode and a drain electrode of the transistor 1010, and a fourth wiring (a 4th Line) is electrically connected to a gate electrode of the transistor 1010. A gate electrode of the transistor 1000 and the other of the source electrode and the drain electrode of the transistor 1010 are electrically connected to one electrode of a capacitor 1020. A fifth line (a 5th Line) and the other electrode of the capacitor 1020 are electrically connected to each other Here, a transistor including an oxide semiconductor is used as the transistor 1010. As the transistor including an oxide semiconductor, the transistor 162 or the transistor 262 described in the above embodiment can be used for example. A transistor including an oxide semiconductor has a characteristic of a significantly low off-state current. Therefore, when the transistor 1010 is turned off, the potential of the gate electrode of the transistor 1000 can be held for a very long time. Moreover, with use of the transistor described in the above embodiment, a short channel effect of the transistor 1010 is suppressed and miniaturization can be realized. Providing the capacitor 1020 facilitates holding of electric charge given to the gate electrode of the transistor 1000 and reading of stored data. As the capacitor 1020, the capacitor described in the above embodiment can be used for example.

In addition, a transistor including a semiconductor material other than an oxide semiconductor is used as the transistor 1000. As the semiconductor material other than an oxide semiconductor, for example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material which is not an oxide semiconductor can easily operate at high speed. Here, as the transistor including a semiconductor material other than an oxide semiconductor, for example, the transistor 160 described in the above embodiments can be used.

Figure 7B:
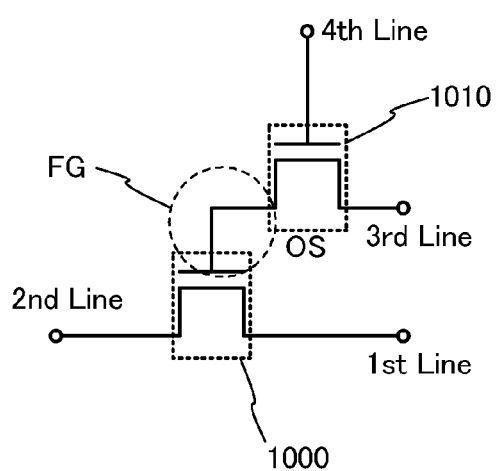

Alternatively, as illustrated in FIG. 7B, a structure without the capacitor 1020 can be employed.

The semiconductor device in FIG. 7A-1 utilizes an advantage that the potential of the gate electrode of the transistor 1000 can be held, whereby writing, holding, and reading of data can be performed as described below.

Firstly, writing and holding of data will be described. First, the potential of the fourth wiring is set to a potential at which the transistor 1010 is turned on, so that the transistor 1010 is turned on. Accordingly, the potential of the third wiring is supplied to the gate electrode of the transistor 1000 and the capacitor 1020. In other words, a predetermined charge is supplied to the gate electrode of the transistor 1000 (i.e., writing of data). Here, one of charges for supply of two different potentials (hereinafter, a charge for supply of a low potential is referred to as a charge $Q_L$ and a charge for supply of a high potential is referred to as a charge $Q_H$) is given. Note that charges giving three or more different potentials may be applied to improve a storage capacity. After that, the potential of the fourth wiring is set to a potential at which the transistor 1010 is turned off, so that the transistor 1010 is turned off. Thus, the charge applied to the gate electrode of the transistor 1000 is held (holding).

Since the off-state current of the transistor 1010 is significantly low, the charge of the gate electrode of the transistor 1000 is held for a long time.

Secondly, reading of data will be described. By supplying an appropriate potential (reading potential) to the fifth wiring with a predetermined potential (constant potential) supplied to the first wiring, the potential of the second wiring varies depending on the amount of charges held in the gate electrode of the transistor 1000. This is because in general, when the transistor 1000 is an n-channel transistor, an apparent threshold voltage $V_{th\_H}$ in the case where $Q_H$ is given to the gate electrode of the transistor 1000 is lower than an apparent threshold voltage $V_{th\_L}$ in the case where $Q_L$ is given to the gate electrode of the transistor 1000. Here, the apparent threshold voltage refers to the potential of the fifth wiring, which is needed to turn on the transistor 1000. Thus, the potential of the fifth wiring is set to potential $V_0$ that is intermediate between $V_{th\_H}$ and $V_{th\_L}$, with which charge supplied to the gate electrode of the transistor 1000 can be determined. For example, in the case where charge $Q_H$ is supplied in writing, when the potential of the fifth wiring is set to $V_0$ ($>V_{th\_H}$), the transistor 1000 is turned on. In the case where $Q_L$ is supplied in writing, when the potential of the fifth wiring is $V_0$ ($<V_{th\_L}$), the transistor 1000 remains off. Therefore, the held data can be read by the measuring potential of the second line.

Note that in the case where memory cells are arrayed to be used, it is necessary to read data only from an intended memory cell. In the case where data of a predetermined memory cell is read out and data of the other memory cells is not read out, a potential at which the transistor 1000 is off regardless of the state of the gate electrode, that is, a potential lower than $V_{th\_H}$, may be applied to the fifth wirings of the memory cells whose data is not to be read. Alternatively, a potential at which the transistor 1000 is on regardless of the state of the gate electrode of the transistor 1000, that is, a potential higher than $V_{th\_L}$ may be given to the fifth wiring.

Thirdly, rewriting of data will be described. Rewriting of data is performed in a manner similar to that of the writing and holding of data. That is, the potential of the fourth wiring is set to a potential at which the transistor 1010 is turned on, so that the transistor 1010 is turned on. Accordingly, the potential of the third wiring (a potential relating to new data) is applied to the gate electrode of the transistor 1000 and the capacitor 1020. After that, the potential of the fourth wiring is set to a potential at which the transistor 1010 is turned off, so that the transistor 1010 is turned off. Accordingly, electric charge related to the new data is given to the gate electrode of the transistor 1000.

In the semiconductor device according to the disclosed invention, data can be directly rewritten by another writing of data as described above. Therefore, extracting of charge from a floating gate with use of a high voltage needed in a flash memory or the like is not necessary and thus, reduction in operation speed, which is attributed to erasing operation, can be suppressed. In other words, high-speed operation of the semiconductor device can be realized.

The source electrode or the drain electrode of the transistor 1010 is electrically connected to the gate electrode of the transistor 1000, thereby having an effect similar to that of a floating gate of a floating gate transistor used for a nonvolatile memory element. Therefore, a portion in the drawing where the source electrode or the drain electrode of the transistor 1010 is electrically connected to the gate electrode of the transistor 1000 is called a floating gate portion FG in some cases. When the transistor 1010 is off, the floating gate portion FG can be regarded as being embedded in an insulator and charge is held in the floating gate portion FG. The amount of off-state current of the transistor 1010 including an oxide semiconductor is smaller than or equal to one hundred thousandth of the amount of off-state current of a transistor including a silicon semiconductor or the like; thus, lost of the charge accumulated in the floating gate portion FG due to leakage current of the transistor 1010 is negligible. That is, with the transistor 1010 including an oxide semiconductor, a nonvolatile memory device which can hold data without being supplied with power can be realized.

For example, when the off-state current of the transistor 1010 at room temperature is 10 zA (1 zA (zeptoampere) is $1 \times 10^{-21}$ A) or less and the capacitance value of the capacitor 1020 is approximately 10 fF, data can be held at least for $10^4$ seconds or longer. It is needless to say that the holding time depends on transistor characteristics and the capacitance value.

Further, in that case, the problem of deterioration of a gate insulating film (tunnel insulating film), which is pointed out in a conventional floating gate transistor, does not exist. That is, the deterioration of a gate insulating film due to injection of an electron into a floating gate, which has been traditionally regarded as a problem, can be solved. This means that there is no limit on the number of times of writing in principle. Furthermore, a high voltage needed for writing or erasing in a conventional floating gate transistor is not necessary.

Figures 2, 7A:
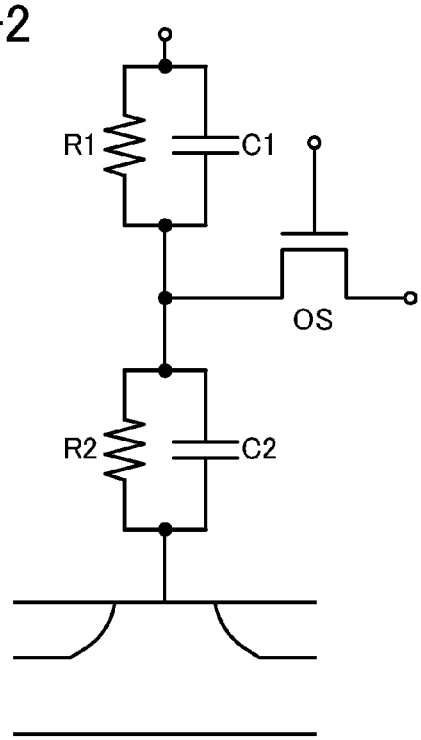

The components such as the transistors included in the semiconductor device in FIG. 7A-1 can be regarded as being composed of a resistor and a capacitor as illustrated in FIG. 7A-2. That is, in FIG. 7A-2, the transistor 1000 and the capacitor 1020 are each regarded as including a resistor and a capacitor. R1 and C1 denote the resistance value and the capacitance value of the capacitor 1020. The resistance value R1 corresponds to the resistance value of an insulating layer included in the capacitor 1020. In addition, R2 and C2 denote the resistance value and the capacitance value of the transistor 1000. The resistance value R2 corresponds to the resistance value of a gate insulating layer at the time when the transistor 1000 is on. The capacitance value C2 corresponds to the capacitance value of so-called gate capacitance (capacitance formed between a gate electrode and each of the source electrode and the drain electrode and capacitance formed between the gate electrode and a channel formation region).

The resistance value (also referred to as effective resistance) between the source electrode and the drain electrode when the transistor 1010 is off is denoted by ROS. When R1 and R2 satisfy the relation of R1≧ROS and R2≧ROS under the condition that gate leakage current of the transistor 1010 is sufficiently low, a period for holding electric charge (also referred to as a data holding period) is determined mainly by the off-state current of the transistor 1010.

On the other hand, in the case where the conditions are not satisfied, it is difficult to sufficiently secure the holding period even if the off-state current of the transistor 1010 is sufficiently low. This is because a leakage current other than the off-state current of the transistor 1010 (e.g., a leakage current generated between the source electrode and the gate electrode) is large. Thus, it can be said that the semiconductor device disclosed in this embodiment desirably satisfies the above relation.

It is desirable that C1≧C2 be satisfied. This is because if C1 is large, the potential of the fifth wiring can be efficiently supplied to the floating gate portion FG when the potential of the floating gate portion FG is controlled by the fifth wiring, so that the difference between potentials supplied to the fifth wiring (e.g., a potential at the time of reading and a potential at the time of non-reading) can be kept small.

When the above relation is satisfied, a more favorable semiconductor device can be realized. Note that R1 and R2 are controlled by the gate insulating layer of the transistor 1000 and the insulating layer of the capacitor 1020. The same applies to C1 and C2. Therefore, the material, the thickness, and the like of the gate insulating layer are desirably set as appropriate to satisfy the above relation.

In the semiconductor device described in this embodiment, the floating gate portion FG has an effect similar to that of a floating gate of a floating gate transistor of a flash memory or the like, but the floating gate portion FG of this embodiment has a feature which is essentially different from that of the floating gate of the flash memory or the like. In the case of a flash memory, since a voltage applied to a control gate is high, it is necessary to keep a proper distance between cells in order to prevent the potential of the control gate from affecting a floating gate of the adjacent cell. This is one of inhibiting factors for high integration of the semiconductor device. The factor is attributed to a basic principle of a flash memory, in which a tunneling current flows in applying a high electrical field.

Further, because of the above principle of a flash memory, deterioration of an insulating film proceeds and thus another problem of the limit on the number of times of rewriting (approximately $10^4$ to $10^5$ times) occurs.

The semiconductor device according to the disclosed invention operates by switching of a transistor including an oxide semiconductor and does not use the above-described principle of charge injection by a tunneling current. That is, a high electrical field for charge injection is not necessary unlike a flash memory. Accordingly, it is not necessary to consider an influence of a high electrical field from a control gate on an adjacent cell, which facilitates high integration.

Further, charge injection by a tunneling current is not utilized, which means that there is no causes for deterioration of a memory cell. In other words, the semiconductor device according to the disclosed invention has higher durability and reliability than a flash memory.

In addition, the semiconductor device according to the disclosed invention has advantages over a flash memory in that a high electric field is unnecessary and a large peripheral circuit (such as a booster circuit) is unnecessary.

In the case where the relative dielectric constant $\in r1$ of the insulating layer included in the capacitor 1020 is different from the relative dielectric constant $\in r2$ of the insulating layer included in the transistor 1000, it is easy to satisfy C1≧C2 while 2·S2≧S1 (desirably, S2≧S1) is satisfied where S1 is the area of the insulating layer included in the capacitor 1020 and S2 is the area of the insulating layer included in a gate capacitor of the transistor 1000. In other words, C1≧C2 can be easily satisfied while the area of the insulating layer included in the capacitor 1020 is made small. Specifically, for example, a film formed of a high-k material such as hafnium oxide or a stack of a film formed of a high-k material such as hafnium oxide and a film formed of an oxide semiconductor is used for the insulating layer included in the capacitor 1020 so that ∈r1 can be set to 10 or more, preferably 15 or more, and silicon oxide is used for the insulating layer included in the gate capacitor so that ∈r2 can be set to 3 to 4.

Use of such a structure in the semiconductor device according to the disclosed invention enables higher integration.

Note that an n-channel transistor in which electrons are majority carriers is used in the above description; it is needless to say that a p-channel transistor in which holes are majority carriers can be used instead of the n-channel transistor.

As described above, a semiconductor device according to one embodiment of the disclosed invention has a nonvolatile memory cell including a writing transistor where a leakage current (off-state current) between a source and a drain is small in an off state, a reading transistor formed using a semiconductor material different from that of the writing transistor, and a capacitor.

In a general silicon semiconductor, it is difficult to reduce the leakage current (the off-state current) to approximately 100 zA ($1 \times 10^{-19}$ A) or less at the temperature in use (e.g., at 25° C.); however, the transistor including an oxide semiconductor which is processed under adequate conditions can realize the above leakage current value. Therefore, a transistor including an oxide semiconductor is preferably used as the writing transistor.

In addition, a transistor including an oxide semiconductor has a small subthreshold swing (S value), so that the switching rate can be sufficiently increased even if mobility is comparatively low. Therefore, by using the transistor as the writing transistor, rising of a writing pulse supplied to the floating gate portion FG can be made very sharp. Further, an off-state current is low and thus, the amount of charges held in the floating gate portion FG can be reduced. That is, by using a transistor including an oxide semiconductor as a writing transistor, rewriting of data can be performed at high speed.

As for the reading transistor, although there is no limitation on off-state current, it is preferable to use a transistor which operates at high speed in order to increase the reading rate. For example, a transistor with a switching rate of 1 nanosecond or lower is preferably used as the reading transistor.

In this manner, when a transistor including an oxide semiconductor is used as a writing transistor, and a transistor including a semiconductor material other than an oxide semiconductor is used as a reading transistor, a semiconductor device capable of holding data for a long time and reading data at high speed, which can be used as a memory device, can be obtained.

Furthermore, when the transistor 162 or the transistor 262 described in the above embodiment is used as a writing transistor, a short channel effect of the writing transistor can be suppressed, and miniaturization can be realized. Therefore, high integration of a semiconductor device which can be used as a memory device can be realized.

The structures, methods, and the like described in this embodiment can be combined as appropriate with any of the structures, methods, and the like described in the other embodiments.

Embodiment 4

In this embodiment, application examples of a semiconductor device according to one embodiment of the disclosed invention will be described with reference to FIGS. 8A and 8B, and FIGS. 9A to 9C. Here, an example of a memory device is described. Note that in each of circuit diagrams, in some cases, "OS" is written beside a transistor in order to indicate that the transistor includes an oxide semiconductor.

Figure 8A:
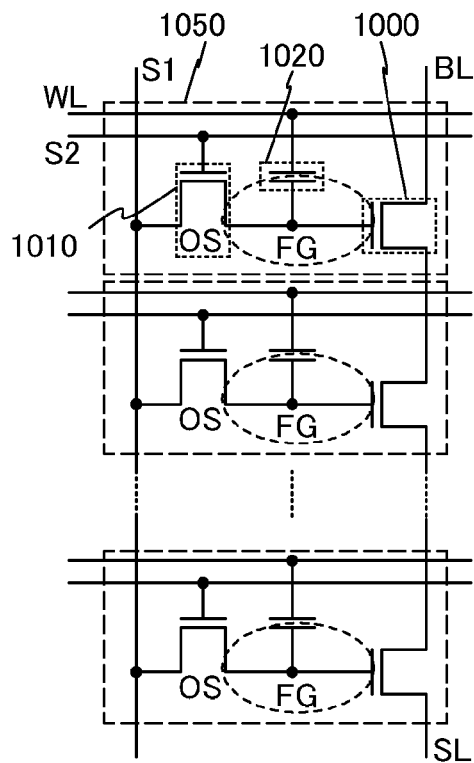
FIGS. 8A and 8B are circuit diagrams of a semiconductor device according to one embodiment of the disclosed invention.
Figure 8B:
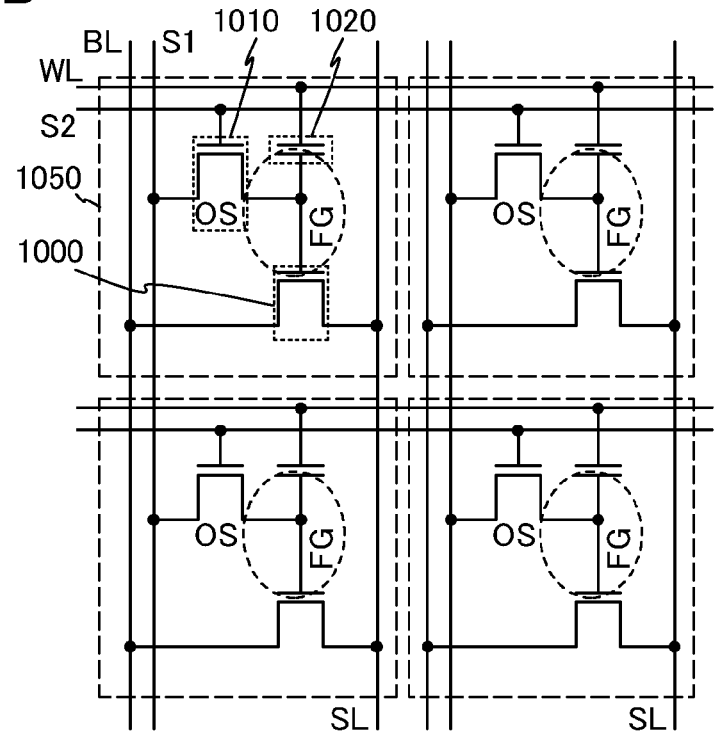

FIGS. 8A and 8B are circuit diagrams of semiconductor devices capable of being used as memory devices each including a plurality of semiconductor devices (hereinafter also referred to as memory cells 1050) illustrated in FIG. 7A-1. FIG. 8A is a circuit diagram of a so-called NAND semiconductor device in which the memory cells 1050 are connected in series, and FIG. 8B is a circuit diagram of a so-called NOR semiconductor device in which the memory cells 1050 are connected in parallel.

The semiconductor device in FIG. 8A includes a source line SL, a bit line BL, a first signal line S1, a plurality of second signal lines S2, a plurality of word lines WL, and the plurality of memory cells 1050. In FIG. 8A, one source line SL and one bit line BL are provided in the semiconductor device; however, one embodiment of the disclosed invention is not limited to this. A plurality of source lines SL and a plurality of bit lines BL may be provided.

In each of the memory cells 1050, the gate electrode of the transistor 1000, one of the source electrode and the drain electrode of the transistor 1010, and one electrode of the capacitor 1020 are electrically connected to one another. In addition, the first signal line S1 and the other of the source electrode and drain electrode of the transistor 1010 are electrically connected to each other, and the second signal line S2 and the gate electrode of the transistor 1010 are electrically connected to each other. The word line WL and the other of the electrodes of the capacitor 1020 are electrically connected to each other.

Further, the source electrode of the transistor 1000 included in the memory cell 1050 is electrically connected to the drain electrode of the transistor 1000 in the adjacent memory cell 1050. The drain electrode of the transistor 1000 included in the memory cell 1050 is electrically connected to the source electrode of the transistor 1000 in another adjacent memory cell 1050. Note that the drain electrode of the transistor 1000 included in the memory cell 1050 at one end of the plurality of memory cells connected in series is electrically connected to the bit line BL. The source electrode of the transistor 1000 included in the memory cell 1050 at the other end of the plurality of memory cells connected in series is electrically connected to the source line SL.

In the semiconductor device in FIG. 8A, writing operation and reading operation are performed in each row. The writing operation is performed as follows. A potential at which the transistor 1010 is turned on is supplied to the second signal line S2 of a row where writing is to be performed, whereby the transistor 1010 of the row where writing is to be performed is turned on. Accordingly, the potential of the first signal line S1 is supplied to the gate electrode of the transistor 1000 in the specified row, so that a predetermined electric charge is supplied to the gate electrode of the transistor 1000. Thus, data can be written to the memory cell of the specified row.

Further, the reading operation is performed as follows. First, a potential at which the transistor 1000 is turned on regardless of charge given to the gate electrode thereof is supplied to the word lines WL of the rows other than the row where reading is to be performed, so that the transistors 1000 of the rows other than the row where reading is to be performed are turned on. Then, a potential (reading potential) at which an on state or an off state of the transistor 1000 is determined depending on electric charge in the gate electrode of the transistor 1000 is supplied to the word line WL of the row where reading is to be performed. After that, a constant potential is supplied to the source line SL so that a reading circuit (not illustrated) connected to the bit line BL is operated. Here, the plurality of transistors 1000 between the source line SL and the bit line BL are on except the transistors 1000 of the row where reading is to be performed; therefore, conductance between the source line SL and the bit line BL is determined by a state (an on state or an off state) of the transistor 1000 of the row where reading is to be performed. Since the conductance of the transistors varies depending on the electric charge in the gate electrode of the transistor 1000 of the row where reading is to be performed, a potential of the bit line BL varies accordingly. By reading the potential of the bit line with the reading circuit, data can be read from the memory cells of the specified row.

The semiconductor device in FIG. 8B includes a plurality of source lines SL, a plurality of bit lines BL, a plurality of first signal lines S1, a plurality of second signal lines S2, a plurality of word lines WL, and a plurality of the memory cells 1050. A gate electrode of the transistor 1000, one of the source electrode and the drain electrode of the transistor 1010, and one of electrodes of the capacitor 1020 are electrically connected to one another. The source line SL and the source electrode of the transistor 1000 are electrically connected to each other. The bit line BL and the drain electrode of the transistor 1000 are electrically connected to each other. In addition, the first signal line S1 and the other of the source electrode and drain electrode of the transistor 1010 are electrically connected to each other, and the second signal line S2 and the gate electrode of the transistor 1010 are electrically connected to each other. The word line WL and the other of the electrodes of the capacitor 1020 are electrically connected to each other.

In the semiconductor device in FIG. 8B, writing operation and reading operation are performed in each row. The writing operation is performed in a manner similar to that of the semiconductor device in FIG. 8A. The reading operation is performed as follows. First, a potential at which the transistor 1000 is turned off regardless of electric charge given to the gate electrodes of the transistors 1000 is supplied to the word lines WL of the rows other than the row where reading is to be performed, so that the transistors 1000 of the rows other than the row where reading is to be performed are turned off. Then, a potential (reading potential) at which an on state or an off state of the transistors 1000 is determined depending on electric charge in the gate electrodes of the transistors 1000 is supplied to the word line WL of the row where reading is to be performed. After that, a constant potential is supplied to the source lines SL so that a reading circuit (not illustrated) connected to the bit lines BL is operated. Here, conductance between the source lines SL and the bit lines BL is determined by a state (an on state or an off state) of the transistors 1000 of the row where reading is to be performed. That is, a potential of the bit lines BL depends on electric charge in the gate electrodes of the transistors 1000 of the row where reading is to be performed. By reading the potential of the bit lines with the reading circuit, data can be read from the memory cells of the specified row.

Although the amount of data which can be held in each of the memory cells 1050 is one bit in the above description, the structure of the semiconductor device of this embodiment is not limited to this. The amount of data which is held in each of the memory cells 1050 may be increased by preparing three or more potentials to be supplied to the gate electrode of the transistor 1000. For example, in the case where the number of potentials to be supplied to the gate electrode of the transistor 1000 is four, data of two bits can be held in each of the memory cells.

Next, examples of reading circuit which can be used for the semiconductor devices illustrated in FIGS. 8A and 8B are described with reference to FIGS. 9A to 9C.

Figure 9A:
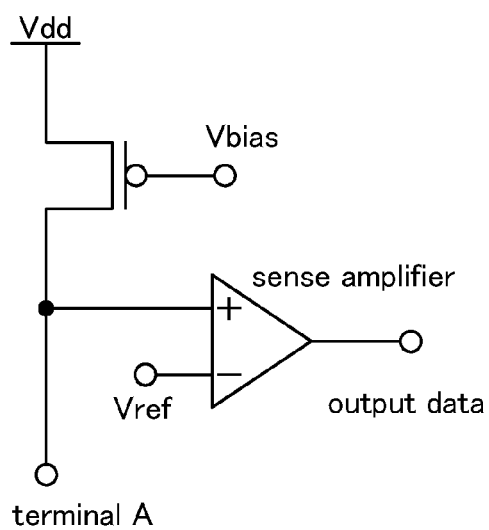
FIGS. 9A to 9C are circuit diagrams of a semiconductor device according to one embodiment of the disclosed invention.

FIG. 9A illustrates a schematic view of a reading circuit. The reading circuit includes a transistor and a sense amplifier circuit.

At the time of reading of data, a terminal A is connected to a bit line to which a memory cell from which data is read is connected. Further, a bias potential Vbias is applied to a gate electrode of a transistor so that a potential of the terminal A is controlled.

The resistance value of the memory cell 1050 varies depending on stored data. Specifically, when the transistor 1000 of the selected memory cell 1050 is turned on, the memory cell 1050 has a low resistance, whereas when the transistor 1000 of the selected memory cell 1050 is turned off, the memory cell 1050 has a high resistance.

When the memory cell has a high resistance, a potential of the terminal A is higher than a reference potential Vref and the sense amplifier circuit outputs a potential corresponding to the potential of the terminal A. On the other hand, when the memory cell has a low resistance, the potential of the terminal A is lower than the reference potential Vref and the sense amplifier circuit outputs a potential corresponding to the potential of the terminal A.

Thus, by using the reading circuit, data can be read from the memory cell. Note that the reading circuit of this embodiment is one of examples. Another circuit may be used. The reading circuit may further include a precharge circuit. Instead of the reference potential Vref, a reference bit line may be connected to the sense amplifier circuit.

Figure 9B:
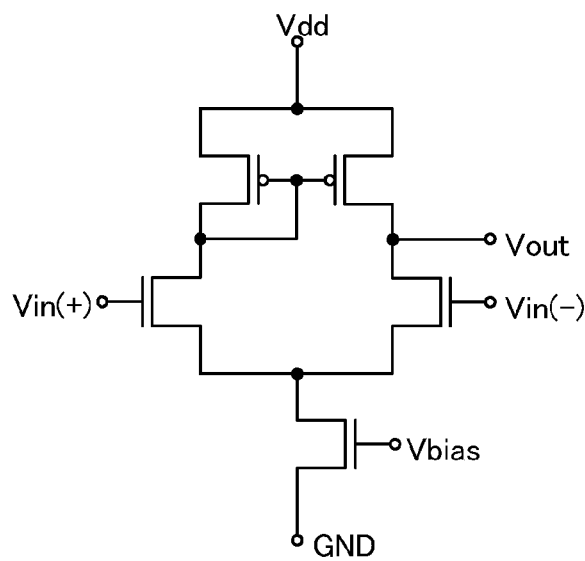

FIG. 9B illustrates a differential sense amplifier which is an example of sense amplifier circuits. The differential sense amplifier has an input terminal Vin(+) and an input terminal Vin(−), and an output terminal Vout, and amplifies the potential difference between Vin(+) and Vin(−). Output of the Vout is approximately high in the case where a potential of Vin(+) is higher than a potential of Vin(−), and is approximately low in the case where a potential of Vin(+) is lower than a potential of Vin(−). In the case where the differential sense amplifier is used for the reading circuit, one of Vin(+) and Vin(−) is connected to the terminal A, and the reference potential Vref is supplied to the other of Vin(+) and Vin(−).

Figure 9C:
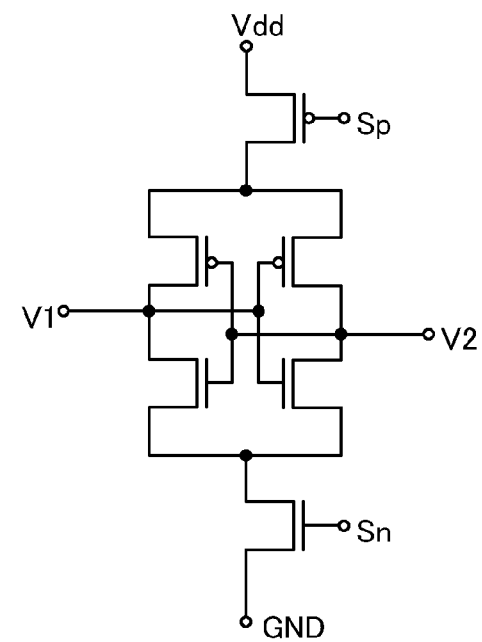

FIG. 9C illustrates a latch sense amplifier which is an example of sense amplifier circuits. The latch sense amplifier has input/output terminals V1 and V2 and input terminals of control signals Sp and Sn. First, the control signals Sp and Sn are set to a signal High and a signal Low, respectively, and a power supply potential (Vdd) is interrupted. Then, potentials V1in and V2 in to be compared are supplied to V1 and V2, respectively. After that, the control signals Sp and Sn are set to a signal Low and a signal High, respectively, and a power supply potential (Vdd) is supplied. If the potentials V1in and V2 in to be compared satisfy the relation V1in>V2 in, output of the V1 is High and output of the V2 is Low, whereas if the potentials satisfy the relation V1in<V2 in, the output of V1 is Low and the output of V2 is High. By utilizing such a relation, the difference between V1in and V2 in can be amplified. In the case where the latch sense amplifier is used for the reading circuit, one of V1 and V2 is connected to the terminal A and the output terminal through a switch, and the reference potential Vref is supplied to the other of V1 and V2.

When in the above semiconductor device which can be used as a memory device, the transistor 162 or the transistor 262 described in the above embodiment is used as the writing transistor in the memory cell, a short channel effect of the writing transistor can be suppressed, and miniaturization can be realized. Therefore, high integration of a semiconductor device which can be used as a memory device can be realized.

The methods and structures described in this embodiment can be combined as appropriate with any of the methods and structures described in the other embodiments.

Embodiment 5

In this embodiment, an application example of a semiconductor device according to one embodiment of the disclosed invention will be described with reference to FIG. 10. Here, a central processing unit (CPU) is described.

Figure 10:
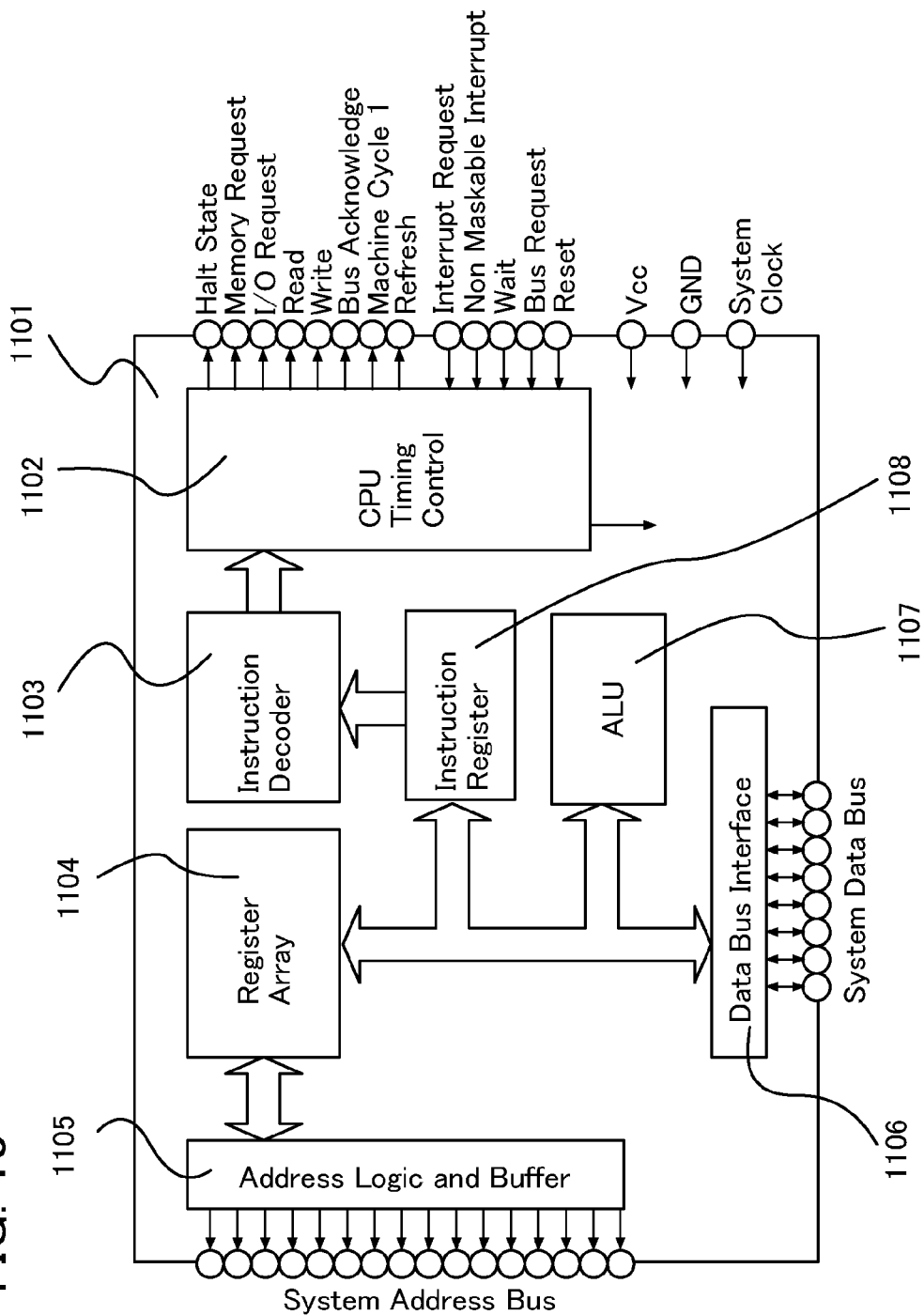
FIG. 10 is a block diagram illustrating a CPU according to one embodiment of the disclosed invention.

An example of a block diagram of a CPU is illustrated in FIG. 10. A CPU 1101 illustrated in FIG. 10 includes a timing control circuit 1102, an instruction decoder 1103, a register array 1104, an address logic and buffer circuit 1105, a data bus interface 1106, an arithmetic logic unit (ALU) 1107, an instruction register 1108, and the like.

These circuits are manufactured using the transistor described in the above embodiments, an inverter circuit, a resistor, a capacitor, and the like. The transistor 162 or the transistor 262 described in the above embodiment enables the off-state current to be extremely low, which can reduce power consumed by the CPU 1101. Further, when the transistor 162 or the transistor 262 described in the above embodiment is used, a short channel effect can be suppressed, and miniaturization can be realized.

Hereinafter, circuits included in the CPU 1101 are briefly described. The timing control circuit 1102 receives instructions from the external, converts them into information for the inside, and transmits the information to another block. In addition, the timing control circuit gives directions such as reading and writing of memory data to the external, according to internal operation. The instruction decoder 1103 serves to convert instruction from the external into instruction for the internal. The register array 1104 has a function of temporarily storing data. The address logic and buffer circuit 1105 has a function of specifying the address of an external memory. The data bus interface 1106 is a circuit for taking data in and out of an external memory or a device such as a printer. The ALU 1107 has a function of performing an operation. The instruction register 1108 has a function of temporarily storing an instruction. The CPU includes combination of such circuits.

When the transistor 162 or the transistor 262 is used for at least part of the CPU 1101, a short channel effect can be suppressed, and miniaturization can be realized. As a result, high integration of the CPU 1101 can be realized.

The structures, methods, and the like described in this embodiment can be combined as appropriate with any of the structures, methods, and the like described in the other embodiments.

Embodiment 6

In this embodiment, an application example of a semiconductor device according to one embodiment of the disclosed invention will be described with reference to FIGS. 11A and 11B. Here, an example of a semiconductor device having an image sensor function for reading out information of an object is described. Note that in a circuit diagram, in some cases, "OS" is written beside a transistor in order to indicate that the transistor includes an oxide semiconductor.

Figure 11A:
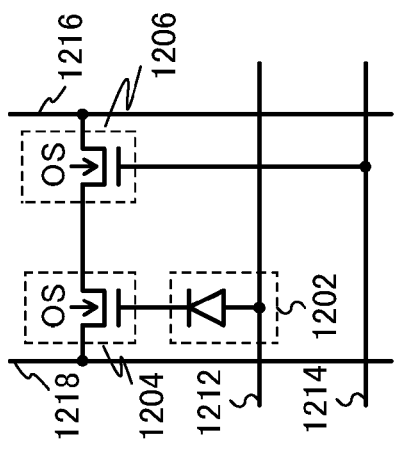
FIGS. 11A and 11B are a circuit diagram of a semiconductor device according to one embodiment of the disclosed invention and a cross-sectional view, respectively.

An example of a semiconductor device having an image sensor function is illustrated in FIG. 11A. FIG. 11A is an equivalent circuit diagram of a photosensor, and FIG. 11B is a cross-sectional view of part of the photosensor.

One electrode of a photodiode 1202 is electrically connected to a photodiode reset signal line 1212, and the other electrode of the photodiode 1202 is electrically connected to a gate electrode of a transistor 1204. One of a source electrode and a drain electrode of the transistor 1204 is electrically connected to a photosensor reference signal line 1218, and the other of the source electrode and the drain electrode of the transistor 1204 is electrically connected to one of a source electrode and a drain electrode of a transistor 1206. A gate electrode of the transistor 1206 is electrically connected to a gate signal line 1214, and the other of the source electrode and the drain electrode of the transistor 1206 is electrically connected to a photosensor output signal line 1216.

Here, the transistor 1204 and the transistor 1206 illustrated in FIG. 11A each includes an oxide semiconductor. As the transistor including an oxide semiconductor, the transistor 162 or the transistor 262 described in the above embodiment can be used. With use of the transistor 162 or the transistor 262 described in the above embodiment, the amount of leakage current in an off state of the transistor can be significantly reduced, whereby photodetection accuracy of the photosensor can be improved. Furthermore, when the transistor 162 or the transistor 262 described in the above embodiment is used, a short channel effect of the transistor can be suppressed, and miniaturization can be realized. As a result, the area of the photodiode can be increased, and the photodetection accuracy of the photosensor can be improved.

Figure 11B:
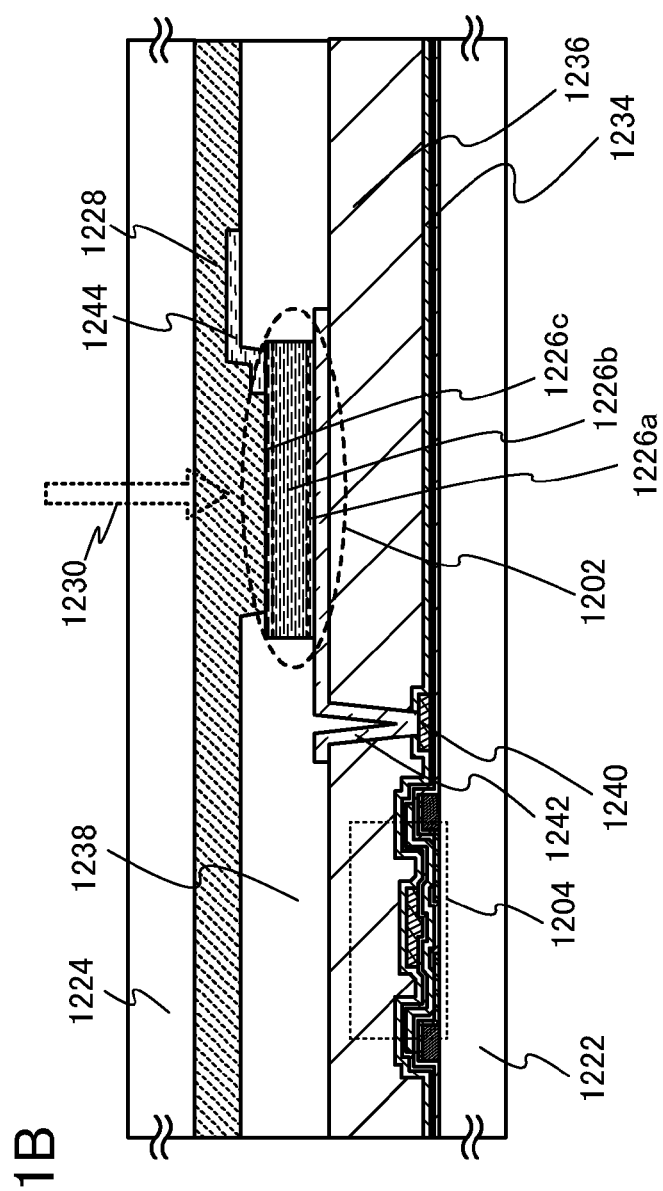

FIG. 11B is a cross-sectional view illustrating the photodiode 1202 and the transistor 1204 in the photosensor, where the photodiode 1202 and the transistor 1204 which function as a sensor are provided over a substrate 1222 having an insulating surface (TFT substrate). A substrate 1224 is provided over the photodiode 1202 and the transistor 1204 with use of an adhesive layer 1228. Over the transistor 1204, an insulating layer 1234, an interlayer insulating layer 1236, and an interlayer insulating layer 1238 are provided.

A gate electrode layer 1240 is formed of the same layer as the gate electrode of the transistor 1204 to have electrical connection therewith. The gate electrode layer 1240 is electrically connected to an electrode layer 1242 provided over the interlayer insulating layer 1236 through an opening provided in the insulating layer 1234 and the interlayer insulating layer 1236. Since the photodiode 1202 is provided over the electrode layer 1242, the photodiode 1202 and the transistor 1204 are electrically connected via the gate electrode layer 1240 and the electrode layer 1242.

The photodiode 1202 has a structure in which a first semiconductor layer 1226a, a second semiconductor layer 1226b, and a third semiconductor layer 1226c are stacked in this order from the electrode layer 1242 side. That is, in the photodiode 1202, the electrode layer 1242 is electrically connected to the first semiconductor layer 1226a, and an electrode layer 1244 provided over the interlayer insulating layer 1238 is electrically connected to the third semiconductor layer 1226c.

Here, a pin photodiode in which a semiconductor layer having n-type conductivity as the first semiconductor layer 1226a, a high-resistance semiconductor layer (i-type semiconductor layer) as the second semiconductor layer 1226b, and a semiconductor layer having p-type conductivity as the third semiconductor layer 1226c are stacked is illustrated as an example.

The first semiconductor layer 1226a is an n-type semiconductor layer and is formed using an amorphous silicon film containing an impurity element imparting n-type conductivity. The first semiconductor layer 1226a is formed by a plasma CVD method using a semiconductor material gas containing an impurity element belonging to Group 15 (such as phosphorus (P)). As the semiconductor material gas, silane (SiH$_4$) may be used. Alternatively, Si$_2$H$_6$, SiH$_2$Cl$_2$, SiHCl$_3$, SiCl$_4$, SiF$_4$, or the like may be used. Further alternatively, an amorphous silicon film which does not contain an impurity element may be formed, and then, an impurity element may be introduced to the amorphous silicon film by a diffusion method or an ion injecting method. Heating or the like may be conducted after introducing the impurity element by an ion injecting method or the like in order to diffuse the impurity element. In this case, as a forming method of the amorphous silicon film, an LPCVD method, a chemical vapor deposition method, a sputtering method, or the like may be used. The first semiconductor layer 1226a is preferably formed so as to have a thickness larger than or equal to 20 nm and smaller than or equal to 200 nm.

The second semiconductor layer 1226b is an i-type semiconductor layer (intrinsic semiconductor layer) and is formed using an amorphous silicon film. As for formation of the second semiconductor layer 1226b, an amorphous silicon film is formed by a plasma CVD method with use of a semiconductor material gas. As the semiconductor material gas, silane (SiH$_4$) may be used. Alternatively, Si$_2$H$_6$, SiH$_2$Cl$_2$, SiHCl$_3$, SiCl$_4$, SiF$_4$, or the like may be used. The second semiconductor layer 1226b may be alternatively formed by an LPCVD method, a chemical vapor deposition method, a sputtering method, or the like. The second semiconductor layer 1226b is preferably formed to have a thickness larger than or equal to 200 nm and smaller than or equal to 1000 nm.

The third semiconductor layer 1226c is a p-type semiconductor layer and can be formed using an amorphous silicon film containing an impurity element imparting p-type conductivity. The third semiconductor layer 1226c is formed by a plasma CVD method with use of a semiconductor material gas containing an impurity element belonging to Group 13 (such as boron (B)). As the semiconductor material gas, silane (SiH$_4$) may be used. Alternatively, Si$_2$H$_6$, SiH$_2$Cl$_2$, SiHCl$_3$, SiCl$_4$, SiF$_4$, or the like may be used. Further alternatively, an amorphous silicon film which does not contain an impurity element may be formed, and then, an impurity element may be introduced to the amorphous silicon film by a diffusion method or an ion injecting method. Heating or the like may be conducted after introducing the impurity element by an ion injecting method or the like in order to diffuse the impurity element. In this case, as a forming method of the amorphous silicon film, an LPCVD method, a chemical vapor deposition method, a sputtering method, or the like may be used. The third semiconductor layer 1226c is preferably formed to have a thickness larger than or equal to 10 nm and smaller than or equal to 50 nm.

The first semiconductor layer 1226a, the second semiconductor layer 1226b, and the third semiconductor layer 1226c are not necessarily formed using an amorphous semiconductor, but they may be formed using a polycrystalline semiconductor or a microcrystalline semiconductor (a semi-amorphous semiconductor (an SAS)).

The microcrystalline semiconductor belongs to a metastable state of an intermediate between amorphous and single crystalline when Gibbs free energy is considered. That is, the microcrystalline semiconductor film is a semiconductor having a third state which is stable in terms of free energy and has a short range order and lattice distortion. Columnar-like or needle-like crystals grow in a normal direction with respect to a substrate surface. The peak of the Raman spectrum of microcrystalline silicon, which is a typical example of a microcrystalline semiconductor, shifts toward lower wavenumbers than 520 cm$^{-1}$, which represents a peak of the Raman spectrum of single crystal silicon. That is, the peak of the Raman spectrum of the microcrystalline silicon exists between 520 cm$^{-1}$ which represents single crystal silicon and 480 cm$^{-1}$ which represents amorphous silicon. In addition, microcrystalline silicon contains hydrogen or halogen at 1 atomic percent at least in order to terminate a dangling bond. Moreover, microcrystalline silicon contains a rare gas element such as helium, argon, krypton, or neon to further promote lattice distortion, so that stability is increased and a favorable microcrystalline semiconductor film can be obtained.

This microcrystalline semiconductor film can be formed by a high-frequency plasma CVD method with a frequency of several tens of megahertz to several hundreds of megahertz, or a microwave plasma CVD method with a frequency of 1 GHz or more. Typically, the microcrystalline semiconductor film can be formed using silicon hydride such as SiH$_4$, Si$_2$H$_6$, SiH$_2$Cl$_2$, SiHCl$_3$, SiCl$_4$, or SiF$_4$, which is diluted with hydrogen. With a dilution with one or plural kinds of rare gas elements selected from helium, argon, krypton, or neon in addition to silicon hydride and hydrogen, the microcrystalline semiconductor film can be formed. In that case, the flow ratio of hydrogen to silicon hydride is 5:1 to 200:1, preferably 50:1 to 150:1, further preferably 100:1. Further, a carbide gas such as CH$_4$ or C$_2$H$_6$, a germanium gas such as GeH$_4$ or GeF$_4$, F$_2$, or the like may be mixed into the gas containing silicon.

In addition, since the mobility of holes generated by the photoelectric effect is lower than that of electrons, a pin photodiode has better characteristics when a surface on the p-type semiconductor layer side is used as a light-receiving plane. Here, the photodiode 1202 receives incident light 1230 on the substrate 1224 side and converts it into an electrical signal. Further, light approaching the semiconductor layer having a conductivity type opposite from that of the semiconductor layer on the light-receiving plane is disturbance light; therefore, the electrode layer 1242 is preferably formed using a light-blocking conductive film. Note that a surface of the n-type semiconductor layer side can alternatively be used as the light-receiving plane.

When the incident light 1230 is incident on the surface of the substrate 1224 side, at least a channel formation region of the oxide semiconductor layer of the transistor 1204 can be shielded from the incident light 1230 by the gate electrode of the transistor 1204.

With use of an insulating material, the insulating layer 1234, the interlayer insulating layer 1236, and the interlayer insulating layer 1238 can be formed, depending on the material, with a method such as a sputtering method, an SOG method, spin coating, dip coating, spray coating, or a droplet discharge method (e.g., an ink-jet method, screen printing, offset printing, or the like), or a tool (equipment) such as a doctor knife, a roll coater, a curtain coater, or a knife coater.

The insulating layer 1234 can be formed using an inorganic insulating material to have a single layer or a stacked layer of any of an oxide insulating layer or a nitride insulating layer such as a silicon oxide layer, a silicon oxynitride layer, a silicon nitride layer, a silicon nitride oxide layer, an aluminum oxide layer, an aluminum oxide nitride layer, an aluminum nitride layer or an aluminum nitride oxide layer. High-density plasma CVD with use of microwaves (2.45 GHz) is preferably employed since formation of a dense and high-quality insulating layer having high withstand voltage is possible.

For reduction of the surface roughness, an insulating layer functioning as a planarization insulating film is preferably used as the interlayer insulating layer 1236 and the interlayer insulating layer 1238. The interlayer insulating layer 1236 and the interlayer insulating layer 1238 can be formed using an organic insulating material having heat resistance such as polyimide, acrylic, benzocyclobutene, polyamide, or epoxy. Other than such organic insulating materials, it is possible to use a single layer or stacked layers of a low-dielectric constant material (a low-k material), a siloxane-based resin, phosphosilicate glass (PSG), borophosphosilicate glass (BPSG), or the like.

When the incident light 1230 on the photodiode 1202 is detected, data of an object can be read. Note that a light source such as a backlight can be used at the time of reading data of an object.

As the transistor including an oxide semiconductor in the photosensor described above, the transistor 162 or the transistor 262 described in the above embodiment can be used. With use of the transistor 162 or the transistor 262 described in the above embodiment, the amount of leakage current in an off state of the transistor can be significantly reduced; accordingly, photodetection accuracy of the photosensor can be improved. Furthermore, when the transistor 162 or the transistor 262 described in the above embodiment is used, a short channel effect of the transistor can be suppressed, and miniaturization can be realized. As a result, the area of the photodiode can be increased, and the photodetection accuracy of the photosensor can be improved.

The methods and structures described in this embodiment can be combined as appropriate with any of the methods and structures described in the other embodiments.

Embodiment 7

In this embodiment, electronic devices to which the semiconductor device described in any of the above embodiments is applied will be described with reference to FIGS. 12A to 12F. In this embodiment, described will be the case where the semiconductor device in any of the above embodiments is applied to an electronic device such as computer, a mobile phone (also referred to as a cellular phone or a mobile phone device), a portable information terminal (including a portable game machine, an audio reproducing device, and the like), a digital camera, a digital video camera, an electronic paper, and a television device (also referred to as a television or a television receiver).

Figure 12A:
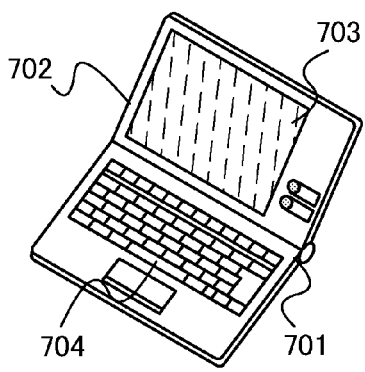
FIGS. 12A to 12F are views illustrating examples of electronic devices.

FIG. 12A illustrates a laptop personal computer including a housing 701, a housing 702, a display portion 703, a keyboard 704, and the like. The semiconductor device described in any of the above embodiments is provided in at least one of the housing 701 and the housing 702. Thus, the laptop personal computer can realize high speed operation and low power consumption, for example.

Figure 12B:
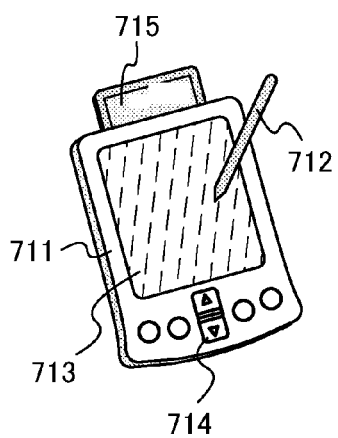

FIG. 12B illustrates a portable information terminal (personal digital assistance (PDA)), in which a main body 711 is provided with a display portion 713, an external interface 715, operation buttons 714, and the like. Further, a stylus 712 and the like for operation of the portable information terminal are provided. In the main body 711, the semiconductor device described in any of the above embodiments is provided. Thus, the portable information terminal can realize high speed operation and low power consumption, for example.

Figure 12C:
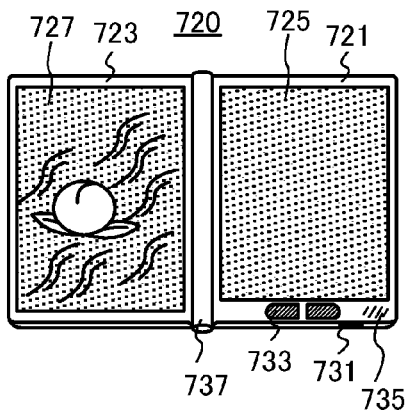

FIG. 12C illustrates an electronic book reader 720 mounting an electronic paper. The electronic book reader has two housings, a housing 721 and a housing 723. The housing 721 and the housing 723 are provided with a display portion 725 and a display portion 727, respectively. The housings 721 and 723 are connected by a hinge portion 737 and can be opened or closed with the hinge portion 737. The housing 721 is provided with a power supply 731, an operation key 733, a speaker 735, and the like. At least one of the housings 721 and 723 is provided with the semiconductor device described in any of the above embodiments. Thus, the electronic book reader can realize high speed operation and low power consumption, for example.

Figure 12D:
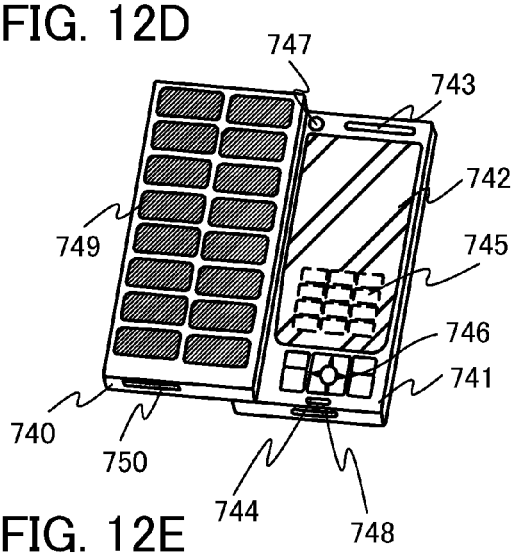

FIG. 12D illustrates a mobile phone including two housings, a housing 740 and a housing 741. Further, the housing 740 and the housing 741 in a state where they are developed as illustrated in FIG. 12D can shift by sliding so that one is lapped over the other; therefore, the size of the mobile phone can be reduced, which makes the mobile phone suitable for being carried. The housing 741 includes a display panel 742, a speaker 743, a microphone 744, an operation key 745, a pointing device 746, a camera lens 747, an external connection terminal 748, and the like. The housing 740 includes a solar cell 749 for charging the mobile phone, an external memory slot 750, and the like. In addition, an antenna is incorporated in the housing 741. At least one of the housings 740 and 741 is provided with the semiconductor device described in any of the above embodiments. Thus, the mobile phone can realize high speed operation and low power consumption, for example.

Figure 12E:
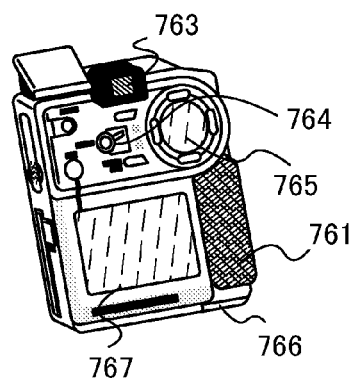

FIG. 12E illustrates a digital camera including a main body 761, a display portion 767, an eyepiece 763, an operation switch 764, a display portion 765, a battery 766, and the like. In the main body 761, the semiconductor device described in any of the above embodiments is provided. Thus, the digital camera can realize high speed operation and low power consumption, for example.

Figure 12F:
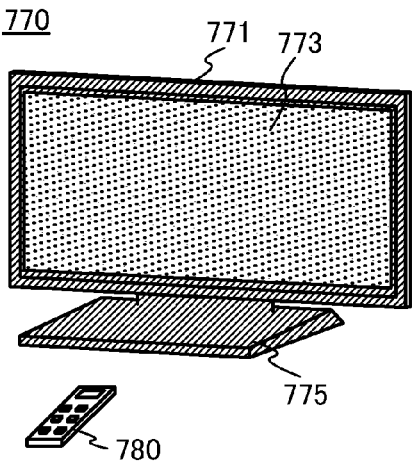

FIG. 12F illustrates a television device 770 including a housing 771, a display portion 773, a stand 775, and the like. The television device 770 can be operated with an operation switch of the housing 771 or a remote controller 780. The semiconductor device described in any of the above embodiments is mounted on the housing 771 and the remote controller 780. Thus, the television device can realize high speed operation and low power consumption, for example.

As described above, on the electronic devices described in this embodiment, the semiconductor device according to any of the above embodiments is mounted. Therefore, an electronic device which can operate at high speed and consume low power due to miniaturization of the semiconductor device can be obtained.

This application is based on Japanese Patent Application serial no. 2010-051021 filed with Japan Patent Office on Mar. 8, 2010, the entire contents of which are hereby incorporated by reference.

The invention claimed is:

1. A semiconductor device comprising:
   a wiring which includes a first conductive layer and a second conductive layer having a smaller thickness than the first conductive layer;
   an insulating layer having an opening portion over the wiring;
   a semiconductor layer over the insulating layer;
   a gate insulating layer over the semiconductor layer; and
   a gate electrode over the gate insulating layer,
   wherein the semiconductor layer is in contact with a part of the wiring through the opening portion in a region comprising a single layer of the second conductive layer in the wiring.

2. The semiconductor device according to claim 1, wherein the second conductive layer has a larger length in a channel length direction than the first conductive layer.

3. The semiconductor device according to claim 1, wherein a material of the second conductive layer is a metal material having higher work function than a material of the semiconductor layer.

4. The semiconductor device according to claim 1, wherein the region, in the wiring, which is led for connection with an external circuit is a region comprising a single layer of the first conductive layer or a region comprising a stacked layer of the first conductive layer and the second conductive layer.

5. The semiconductor device according to claim 1, wherein the region comprising the single layer of the second conductive layer in the wiring includes the second conductive layer extended beyond an edge portion of the first conductive layer in a channel width direction.

6. The semiconductor device according to claim 1, wherein the second conductive layer is on and in direct contact with the first conductive layer.

7. The semiconductor device according to claim 1, wherein the first conductive layer comprising a material with higher conductivity than a material of the second conductive layer.

8. The semiconductor device according to claim 1, wherein the wiring is a drain wiring.

9. A semiconductor device comprising:
a source wiring and a drain wiring each of which includes a first conductive layer and a second conductive layer having a smaller thickness than the first conductive layer;
an insulating layer having an opening portion over the source wiring and the drain wiring;
a semiconductor layer over the insulating layer;
a gate insulating layer over the semiconductor layer; and
a gate electrode over the gate insulating layer,
wherein the semiconductor layer is in contact with a part of the source wiring or the drain wiring through the opening portion in a region comprising a single layer of the second conductive layer in the source wiring or the drain wiring, and
wherein the semiconductor layer is an oxide semiconductor layer.

10. The semiconductor device according to claim 9, wherein the second conductive layer has a larger length in a channel length direction than the first conductive layer.

11. The semiconductor device according to claim 9, wherein a material of the second conductive layer is a metal material having higher work function than a material of the semiconductor layer.

12. The semiconductor device according to claim 9, wherein the region, in each of the source wiring and the drain wiring, which is led for connection with an external circuit is a region comprising a single layer of the first conductive layer or a region comprising a stacked layer of the first conductive layer and the second conductive layer.

13. The semiconductor device according to claim 9, wherein the region comprising the single layer of the second conductive layer in the source wiring or the drain wiring includes the second conductive layer extended beyond an edge portion of the first conductive layer in a channel width direction.

14. The semiconductor device according to claim 9, wherein the second conductive layer is on and in direct contact with the first conductive layer.

15. The semiconductor device according to claim 9, wherein the first conductive layer comprising a material with higher conductivity than a material of the second conductive layer.

16. A semiconductor device comprising:
a source wiring and a drain wiring each of which includes a first conductive layer and a second conductive layer having a smaller thickness than the first conductive layer;
an insulating layer having an opening portion over the source wiring and the drain wiring;
a semiconductor layer over the insulating layer;
a gate insulating layer over the semiconductor layer; and
a gate electrode over the gate insulating layer,
wherein the semiconductor layer is in contact with a part of the source wiring or the drain wiring through the opening portion in a region comprising a single layer of the second conductive layer in the source wiring or the drain wiring,
wherein the semiconductor layer is an oxide semiconductor layer, and
wherein the insulating layer is provided so as to fill a space between the source wiring and the drain wiring.

17. The semiconductor device according to claim 16, wherein the second conductive layer has a larger length in a channel length direction than the first conductive layer.

18. The semiconductor device according to claim 16, wherein a material of the second conductive layer is a metal material having higher work function than a material of the semiconductor layer.

19. The semiconductor device according to claim 16, wherein the region, in each of the source wiring and the drain wiring, which is led for connection with an external circuit is a region comprising a single layer of the first conductive layer or a region comprising a stacked layer of the first conductive layer and the second conductive layer.

20. The semiconductor device according to claim 16, wherein the region comprising the single layer of the second conductive layer in the source wiring or the drain wiring includes the second conductive layer extended beyond an edge portion of the first conductive layer in a channel width direction.

21. The semiconductor device according to claim 16, wherein the second conductive layer is on and in direct contact with the first conductive layer.

22. The semiconductor device according to claim 16, wherein the first conductive layer comprising a material with higher conductivity than a material of the second conductive layer.

* * * * *